(12) United States Patent
Namekawa

(10) Patent No.: US 6,205,079 B1
(45) Date of Patent: Mar. 20, 2001

(54) SEMICONDUCTOR INTEGRATED CIRCUIT HAVING POWER-SUPPLY CIRCUITS FOR PRODUCING INTERNAL SUPPLY VOLTAGES

(75) Inventor: Toshimasa Namekawa, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/577,557

(22) Filed: May 24, 2000

(30) Foreign Application Priority Data

May 25, 1999 (JP) .................................................. 11-145148

(51) Int. Cl.$^7$ ....................................................... G11C 7/00
(52) U.S. Cl. ..................... 365/226; 365/189.06; 327/536; 327/589
(58) Field of Search .............................. 365/226, 189.06, 365/230.06; 327/589, 536, 537

(56) References Cited

U.S. PATENT DOCUMENTS

| 4,994,689 | 2/1991 | Kikuda et al. ................... 365/189.06 |
| 5,363,333 | * 11/1994 | Tsujimoto ............................ 365/226 |
| 5,376,839 | 12/1994 | Horiguchi et al. ................... 327/541 |
| 5,828,596 | * 10/1998 | Takata et al. ......................... 365/226 |
| 5,889,719 | * 3/1999 | Yoo et al. ............................ 365/226 |
| 5,898,635 | * 4/1999 | Raad et al. ........................... 365/226 |
| 6,052,022 | * 4/2000 | Lee ...................................... 365/226 |

FOREIGN PATENT DOCUMENTS

| 1-13757 | 1/1989 | (JP) . |
| 2-134862 | 5/1990 | (JP) . |
| 2-153621 | 6/1990 | (JP) . |
| 3-112158 | 5/1991 | (JP) . |
| 5-54673 | 3/1993 | (JP) . |
| 5-101658 | 4/1993 | (JP) . |
| 5-120873 | 5/1993 | (JP) . |
| 9-83334 | 3/1997 | (JP) . |
| 10-222980 | 8/1998 | (JP) . |
| 10-228769 | 8/1998 | (JP) . |
| 10-284686 | 10/1998 | (JP) . |

* cited by examiner

Primary Examiner—Son T. Dinh
(74) Attorney, Agent, or Firm—Banner & Witcoff, Ltd.

(57) ABSTRACT

A semiconductor integrated circuit comprises a first internal power supply circuit for producing a first internal supply voltage, a clamp circuit for short-circuiting an output node of the first internal power supply circuit and a first external power supply node, a power-on sensing circuit for, upon detecting a second external supply voltage having reached a specified value, producing a first control signal, a second internal power supply circuit responsive to the second external supply voltage for producing a second internal supply voltage, and a potential detecting circuit for, upon detecting the second internal supply voltage having reached a specified value, producing a second control signal. The clamp circuit is enabled by the first control signal from the power-on sensing circuit to short-circuit the first internal power supply node and the first external power supply node and disabled by the second control signal from the potential detecting circuit from short-circuiting, thereby allowing the first internal power supply circuit to produce the first internal supply voltage.

20 Claims, 15 Drawing Sheets

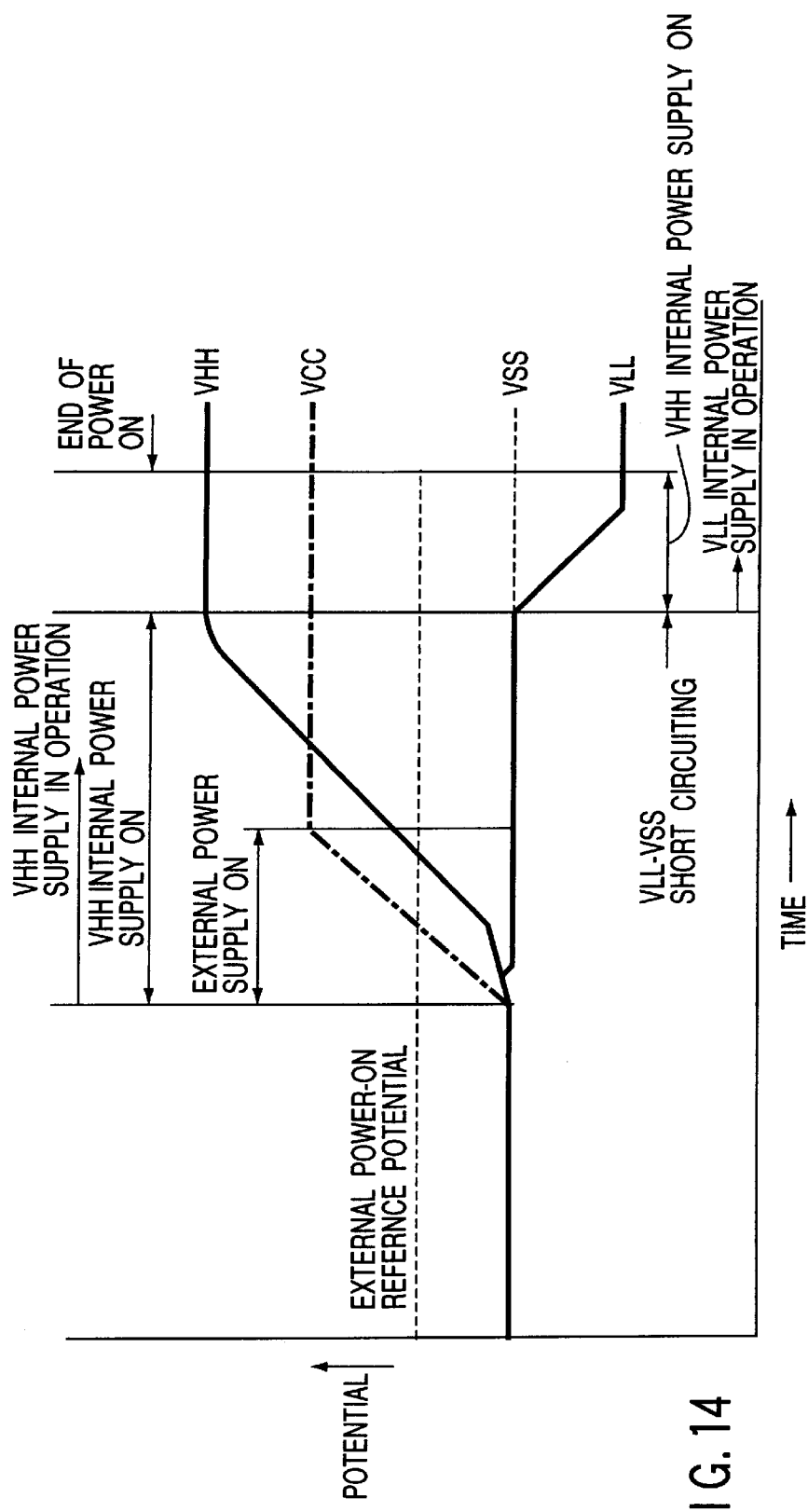
F I G. 14

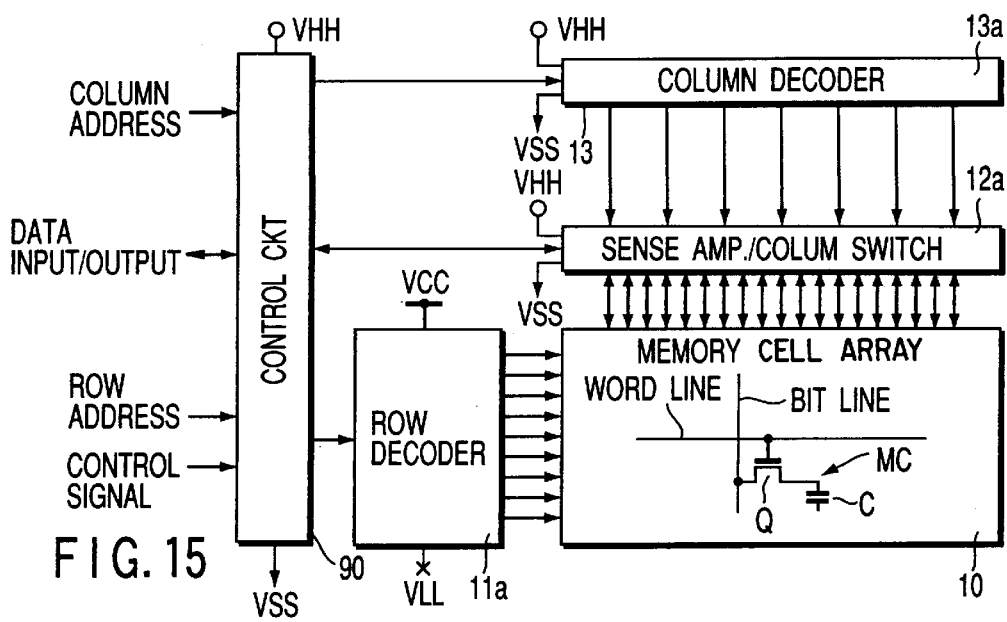
FIG. 15
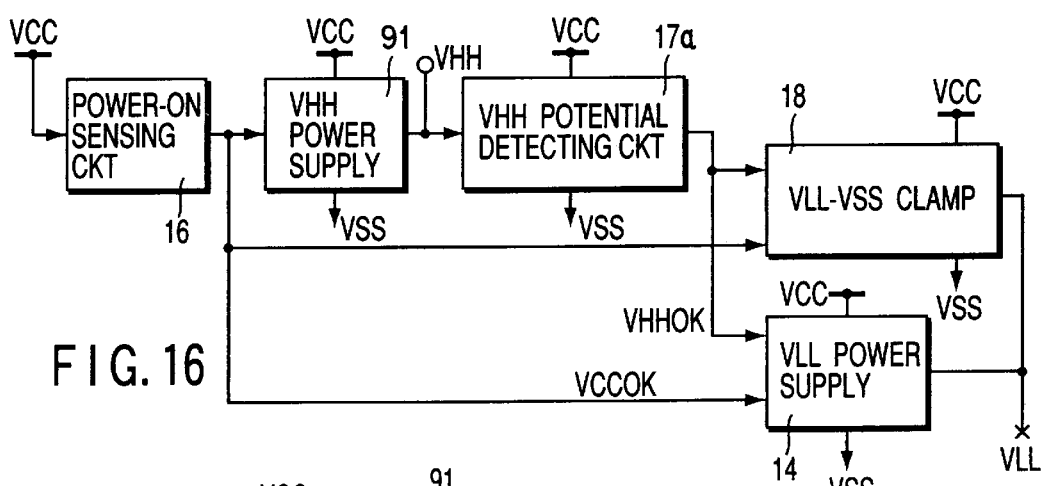
FIG. 16
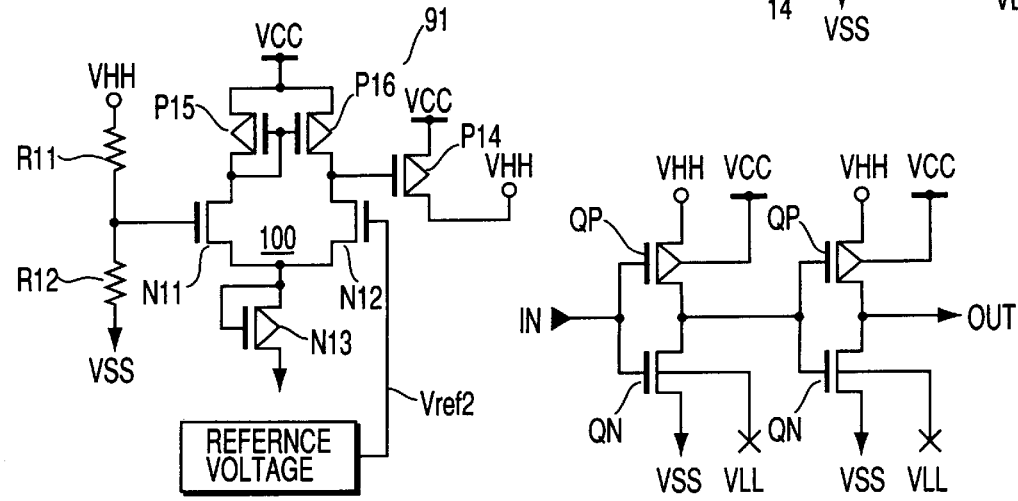
FIG. 17
FIG. 18

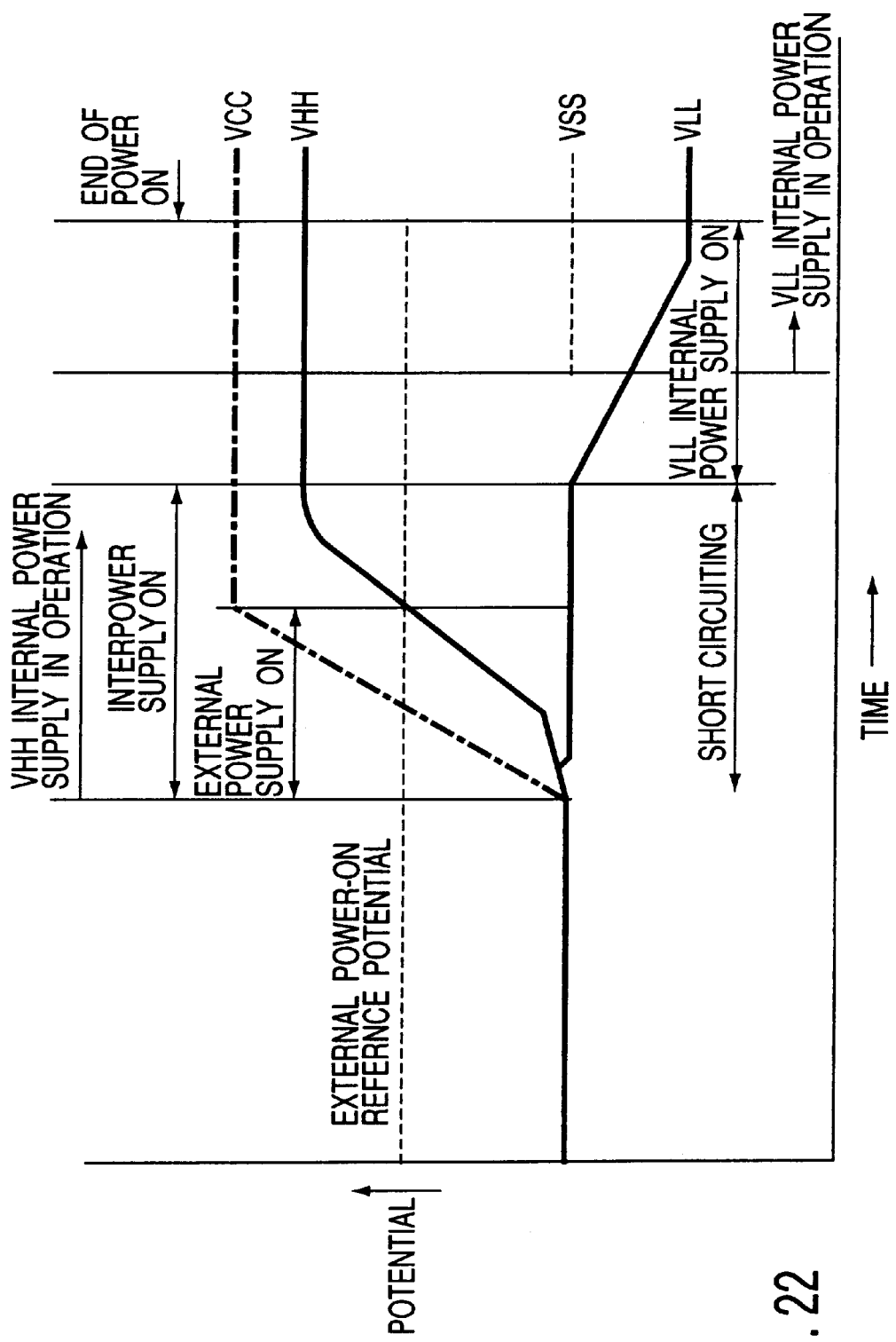
F I G. 22

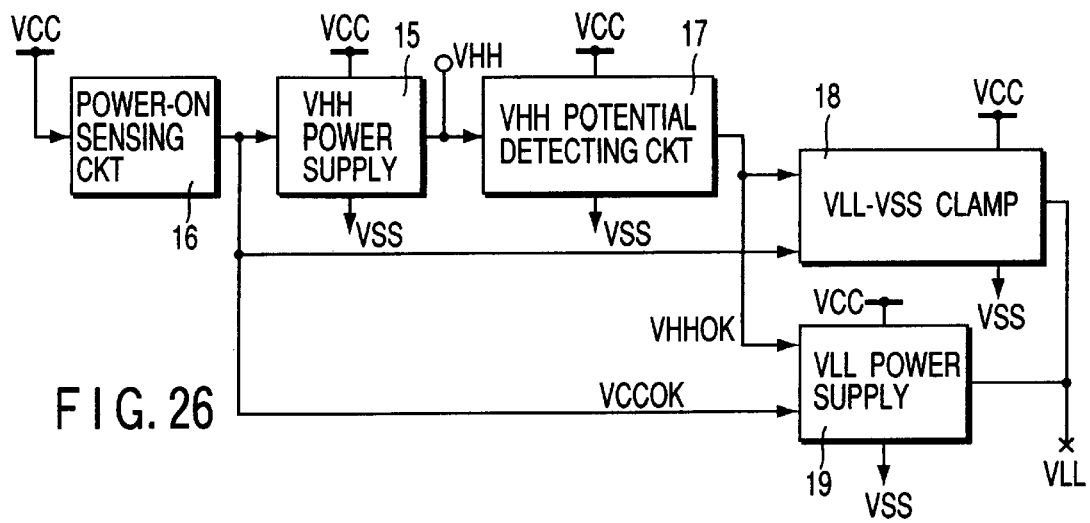
F I G. 26
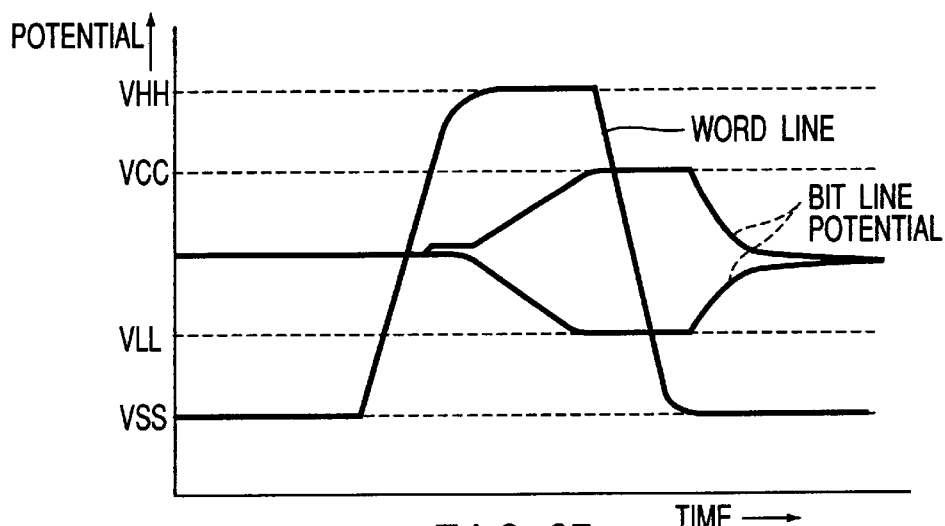
F I G. 27
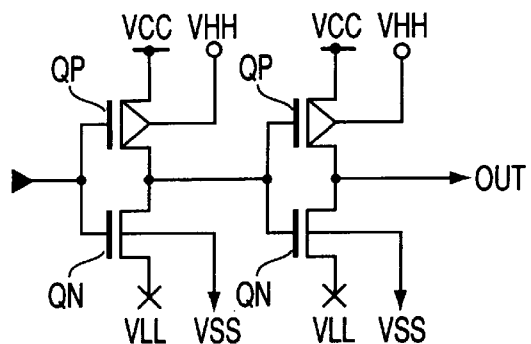
F I G. 28

SEMICONDUCTOR INTEGRATED CIRCUIT HAVING POWER-SUPPLY CIRCUITS FOR PRODUCING INTERNAL SUPPLY VOLTAGES

CROSS-REFERENCE TO RELATED APPLICATIONS

This application is based upon and claims the benefit of priority from the prior Japanese Patent Application No. 11-145148, filed May 25, 1999, the entire contents of which are incorporated herein by reference.

BACKGROUND OF THE INVENTION

The present invention relates to a semiconductor integrated circuit, such as an LSI circuit, and more specifically to an LSI circuit with a plurality of internal power supplies, which is adapted for a semiconductor memory device by way of example.

LSI circuits having more than one internal power supply include DRAMs employing a negative word line (NWL) driving technique. An example of an NWL driving technique is described in an article entitled "Circuit Design Techniques for Low-Voltage Operating and/or Giga-Scale DRAMs" by Tadato Y. et al., ISSCC Digest of Technical Papers, pp. 248–249, 1995.

This NWL technique has been proposed to meet low supply voltage requirements of DRAMs. A part of the circuit arrangement of a DRAM that employs the NWL driving technique is shown in FIG. 1. FIG. 2 shows exemplary waveforms of potentials on word and bit lines.

Although a large number of memory cells each consisting of a transistor Q and a capacitor C is arranged in rows and columns, only one memory cell is illustrated in FIG. 1. WL denotes a word line, which is connected to the gate of transistor Q in the memory cell. BL and /BL denote paired bit lines. The bit line /BL is connected to the drain of the transistor Q. WLD denotes a word line driver. SA denotes a sense amplifier. SAD denotes a sense amplifier driver.

In FIG. 2, solid lines indicate potentials on the word line WL and the paired bit lines BL and /BL. For comparison, a dashed line indicates a word line driving waveform in a DRAM in which no NWL driving technique is used.

As shown in FIG. 2, in the NWL driving technique, the potential on the word line WL in the non-selected state is a low potential VLL, which is lower than 0 V (VSS), i.e., the low level potential of the bit lines (the low level "L" of the sense amplifier SA). Thereby, a negative bias voltage is applied between the gate and source of the transistor Q, suppressing cut-off current and consequently enhancing information holding capability.

The potential on the word line WL in selected state is a high potential VHH, which is set Vth+α higher than the high-level potential of the bit line (the high level of the sense amplifier; the supply voltage VCC in this example). Vth denotes the threshold voltage of the transistor Q. Namely, the high potential VHH is set more than Vth higher than the high-level potential of the bit line. Thus, the potential on the bit line BL or /BL is fully transferred to the capacitor C.

As described above, in the NWL-based DRAM, a row decoder (not shown) for driving the word lines WL uses the negatively boosted voltage VLL and the positively boosted voltage VHH. These boosted voltages VLL and VHH are produced by internal power supply circuits built into a DRAM chip. However, when the boosted voltages VLL and VHH are produced by internal power supply circuits built into a DRAM chip, the following problems may arise at the time of turning on the power.

That is, at power-on time, the internal signal potential is either midway between VCC and VSS or in transition. In this state, not only charge/discharge currents but also through-currents flow through internal CMOS logic circuits, increasing current dissipation.

If, in this state, the VHH power supply circuit cannot compensate for through-currents in a CMOS circuit serving as the row decoder, the boosted voltage VHH will not reach the specified voltage. Thus, the VHH power supply circuit needs to have a current supply capacity great enough to compensate for through-currents that flow at power-on time. Usually, the same holds true for the VLL power supply circuit. In addition, it is required that the current supply capacity be balanced between the VHH and VSS power supply circuits.

If such requirements are not met, simultaneously operating the VHH and VSS power supply circuits at power-on time causes a phenomenon in which one of the supply voltages which is produced by a power supply circuit smaller in current supply capacity than the other rises or falls abnormally.

FIG. 3 shows a situation where the output voltage VLL of the VLL power supply circuit rises abnormally when the power is turned on.

It is expected that the boosted voltage VHH is higher than the external supply voltage VCC and the boosted voltage VLL is lower than 0 V (VSS). In a state contrary to this expectation, problems often arise in the operation of the row decoder using internal boosting power supply circuits and current dissipation increases. If the internal power supply circuit cannot accommodate the current dissipation, then the internal supply voltage further increases or decreases. That is, a vicious cycle of an increase in current dissipation and an increase or decrease in internal supply voltage is caused.

A Vt CMOS technique is known which suppresses the cutoff current of MOS transistors in CMOS logic circuits to attain a reduction in their standby current by controlling the backgate voltage of the MOS transistors.

In the conventional Vt CMOS technique, CMOS circuits connected between VCC and VSS nodes are arranged, as shown in FIG. 4, such that NMOS transistors have their sources connected to the external supply voltage VSS and their backgates connected to the internal boosted supply voltage VLL and PMOS transistors have their sources connected to the external supply voltage VCC and their backgates connected to the internal boosted supply voltage VHH.

As shown in FIG. 5, the CMOS inverters are set such that the voltages VHH and VLL in standby state are respectively set higher and lower than in active state. Thus, in the standby state the backgate of each of the NMOS and PMOS transistors becomes biased deeply, which allows the threshold voltage of each transistor to be increased and the standby current to be reduced.

As described above, the conventional DRAMs having more than one internal power supply circuits have a problem that difficulties are involved in producing internal supply voltages with stability at the time of turning on the power.

BRIEF SUMMARY OF THE INVENTION

It is therefore an object of the present invention to provide a semiconductor integrated circuit which has more than one internal power supply circuit which permits internal supply voltages to be produced with stability at the time of turning on the power.

According an aspect of the present invention, there is provided a semiconductor integrated circuit comprising: a first node for receiving a first voltage which is externally supplied; a second node for receiving a second voltage that differs in magnitude from the first voltage; a first internal power supply circuit responsive to at least the second voltage on the second node for producing a first internal supply voltage that differs in magnitude from the first voltage; a first voltage detecting circuit connected to receive the second voltage from the second node for, upon detecting that the magnitude of the voltage on the second node has reached a first specified value, producing a first detect signal; a second internal power supply circuit responsive to at least the second voltage on the second node for producing a second internal supply voltage that differs in magnitude from the second voltage; a second voltage detecting circuit connected to receive the second internal supply voltage from the second internal power supply circuit for, upon detecting that the magnitude of the second internal supply voltage has reached a second specified value, producing a second detect signal which causes the first internal power supply circuit to start producing the first internal supply voltage; and a clamp circuit coupled to an output of the first internal power supply circuit and the first node for, upon receiving the second detect signal, releasing a short-circuited state of the output of the first internal power supply circuit and the first node.

According to another aspect of the present invention, there is provided a semiconductor integrated circuit comprising: a first node for receiving a first voltage which is externally supplied; a second node for receiving a second voltage that differs in magnitude from the first voltage; a first internal power supply circuit responsive to at least the second voltage on the second node for producing a first internal supply voltage that differs in magnitude from the first voltage; a first voltage detecting circuit connected to receive the second voltage from the second node for, upon detecting that the magnitude of the voltage on the second node has reached a first specified value, producing a first detect signal; a second internal power supply circuit responsive to at least the second voltage on the second node for producing a second internal supply voltage that differs in magnitude from the second voltage; a second voltage detecting circuit connected to receive the first internal supply voltage from the first internal power supply circuit for, upon detecting that the magnitude of the first internal supply voltage has reached a second specified value, producing a second detect signal which causes the second internal power supply circuit to start producing the second internal supply voltage; and a clamp circuit coupled to an output of the second internal power supply circuit and the first node for, upon receiving the second detect signal, releasing a short-circuited state of the output of the second internal power supply circuit and the first node.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 14 shows operating voltage waveforms at power-on time in the power supply system of FIG. 7;

FIG. 15 is a schematic representation of an NWL driving-based DRAM according to a second embodiment of the present invention;

FIG. 16 is a block diagram of the power supply system used in the DRAM of FIG. 15;

FIG. 17 shows a circuit arrangement of the VHH power supply circuit in FIG. 16;

FIG. 18 shows a circuit arrangement of CMOS logic circuits used in the sense amplifier, row decoder and control circuit in FIG. 15;

FIG. 22 shows operating voltage waveforms at power-on time in the power supply system of FIG. 16;

FIG. 26 is a block diagram of the power supply system of a DRAM according to a third embodiment of the present invention;

FIG. 27 shows operating waveforms in a DRAM operated from internal supply voltages produced by the power supply system of FIG. 26 and external supply voltages;

FIG. 28 shows the circuit arrangement of CMOS logic circuits using the Vt CMOS technique in the third embodiment;

DETAILED DESCRIPTION OF THE INVENTION

The preferred embodiments of the present invention will be described with reference to the accompanying drawings.

Figure 6:
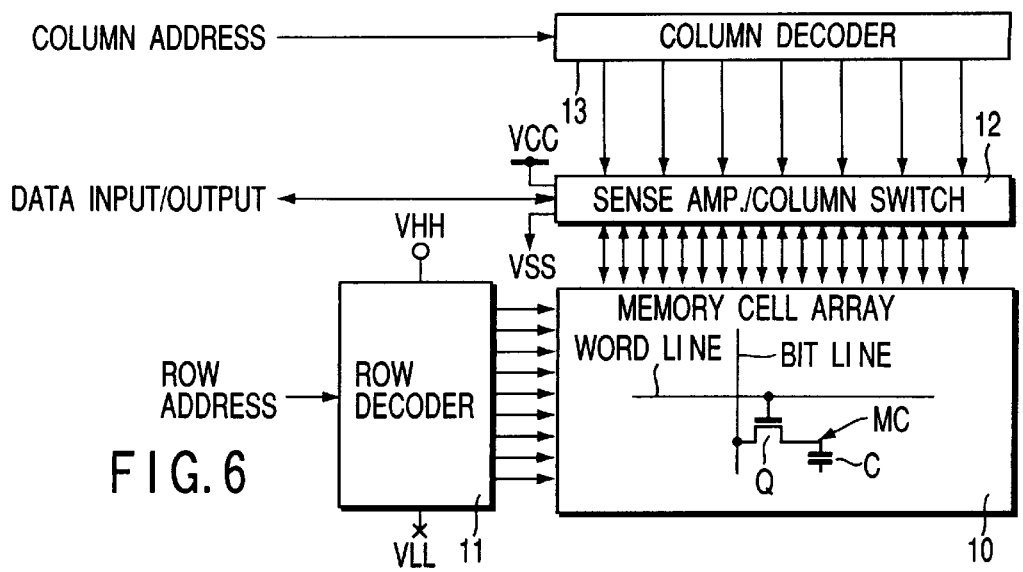
FIG. 6 is a schematic representation of an NWL driving-based DRAM according to a first embodiment of the present invention.
Figure 7:
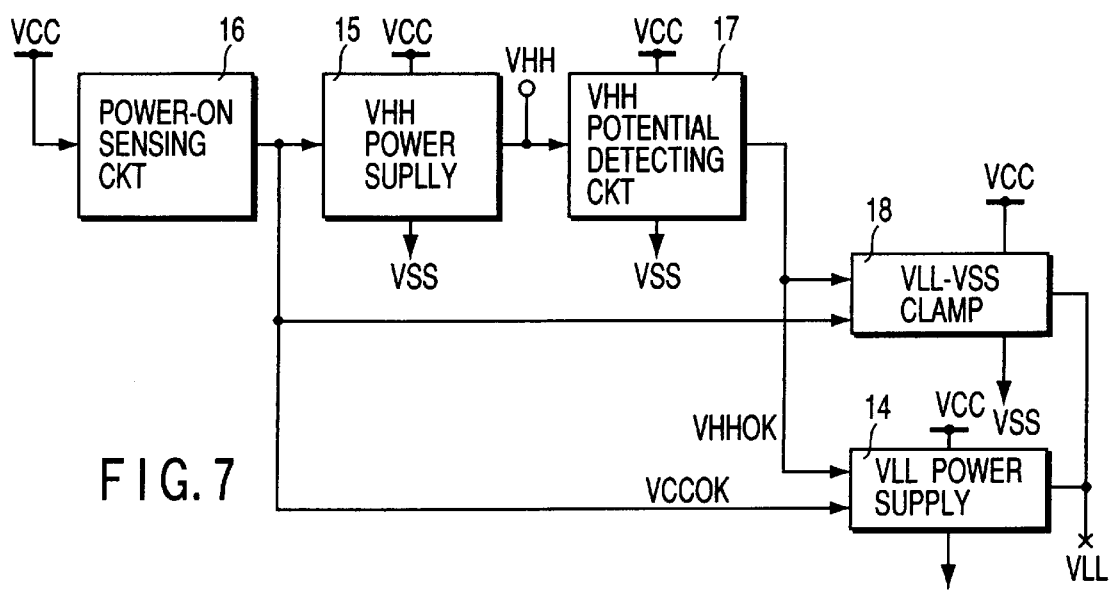
FIG. 7 is a block diagram of the power supply system used in the DRAM of FIG. 6.

FIG. 6 is a schematic representation of an NWL-driving-based DRAM according to a first embodiment of the present invention. FIG. 7 is a block diagram of the power supply system of the DRAM of FIG. 6. In FIG. 6, in a memory cell array 10 in which a number of memory cells MC (only one is illustrated in FIG. 6), each consisting of a transistor Q and a capacitor C, are arranged in rows and columns, word lines WLi are arranged in the row direction and bit lines BLi are arranged in the column direction.

A row decoder 11 decodes row address signals to drive selectively a word line WLi. A sense amplifier/column switch circuit 12 comprises a number of sense amplifiers that sense and amplify data read onto the bit lines BLi and a number of column switches for making selections among the columns of the memory cell array 10.

The DRAM of this embodiment is supplied with a first external supply voltage VSS of 0 V and a second external supply voltage VCC having a positive value and has two built-in internal power supply circuits that produce a first internal boosted voltage VLL and a second internal boosted voltage VHH. The first boosted voltage VLL, which is lower than the first external supply voltage VSS and hence has a negative value, is applied to the row decoder 11, etc. The second boosted voltage VHH, which is higher than the second external supply voltage VCC and hence has a positive value, is applied to the row decoder 11, etc.

The power supply system is constructed, as shown in FIG. 7, from a VLL power supply circuit 14 that produces the first boosted voltage VLL, a VHH power supply circuit 15 that produces the second boosted voltage VHH, a power-on sensing circuit 16, a VHH potential detecting circuit 17, and a VLL-VHH clamp circuit 18.

The power-on sensing circuit 16 is supplied with the external supply voltage VCC and, upon detecting that the voltage VCC has reached a specified value, produces a control signal VCCOK. The VHH power supply circuit 15 performs a boosting operation on the external supply voltage VCC to produce the boosted voltage VHH higher than VCC. The VHH detecting circuit 17 detects the magnitude of the voltage VHH produced by the VHH power supply circuit 15 and, upon detecting that VHH has reached a specified value, produces a control signal VHHOK. The VLL-VSS clamp circuit 18 is adapted, when required, to short-circuit the output node of the VLL power supply circuit 14 and the VSS node. The operating state of the clamp circuit 18 is controlled by the control signal VCCOK from the power-on sensing circuit 16 and the control signal VHHOK from the VHH potential detecting circuit 17. In this case, when receiving the control signal VCCOK from the power-on sensing circuit 16 after power-on, the clamp circuit 18 performs a clamping operation by which the output node of the VLL power supply circuit 14 and the VSS node are short-circuited, or the internal supply voltage VLL is clamped to the external supply voltage VSS. When VHH has reached a specified value, the clamping circuit 18 is released from the clamping operation by the control signal VHHOK from the VHH potential detecting circuit 17.

When the output voltage VHH of the VHH power supply circuit 15 has reached the specified value, the VLL power supply circuit 14 is controlled by the control signal VHHOK from the VHH potential sensing circuit 17 to commence a boosting operation. That is, the boosting operation of the VHH power supply circuit 15 is commenced with the clamping state of the clamping circuit 18 held. When the output voltage VHH has reached the specified value, the clamping state of the clamp circuit 18 is released by the control signal VHHOK from the VHH potential detecting circuit 17, allowing the VLL power supply circuit 14 to commence the boosting operation.

Figure 8:
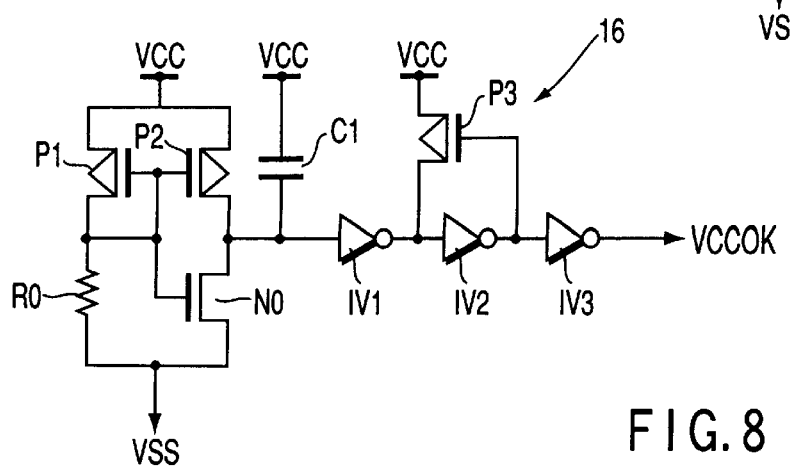
FIG. 8 shows a circuit arrangement of the power-on sensing circuit in FIG. 7.

FIG. 8 shows a specific circuit arrangement of the power-on sensing circuit 16 in FIG. 7. The circuit comprises a series combination of a first PMOS transistor P1 and a resistor R0 and a series combination of a second PMOS transistor P2 and an NMOS transistor N0 which are connected between the VCC and VSS nodes, a capacitor C1 connected between the common drains of the transistors P2 and N0 and the VCC node, three inverters IV1, IV2 and IV3 connected in cascade between the common drains of the transistors P2 and N0 and the control signal VCCOK output node, and a third PMOS transistor P3 having its source-drain path connected between an input node of the inverter IV2 and the VCC node and its gate connected to an output of the inverter IV2.

The first and second PMOS transistors P1 and P2 have their gates connected together to the drain of the transistor P1 and to the gate of the transistor N1.

The power-on sensing circuit of FIG. 8 operates in such a way as to set the control signal VCCOK at the VSS (low) level when the potential difference between VCC and VSS is equal to or less than the sum of threshold voltages of the respective transistors P2 and N0, i.e., |Vthp|+Vthn, and at the VCC (high) level otherwise.

Figure 9:
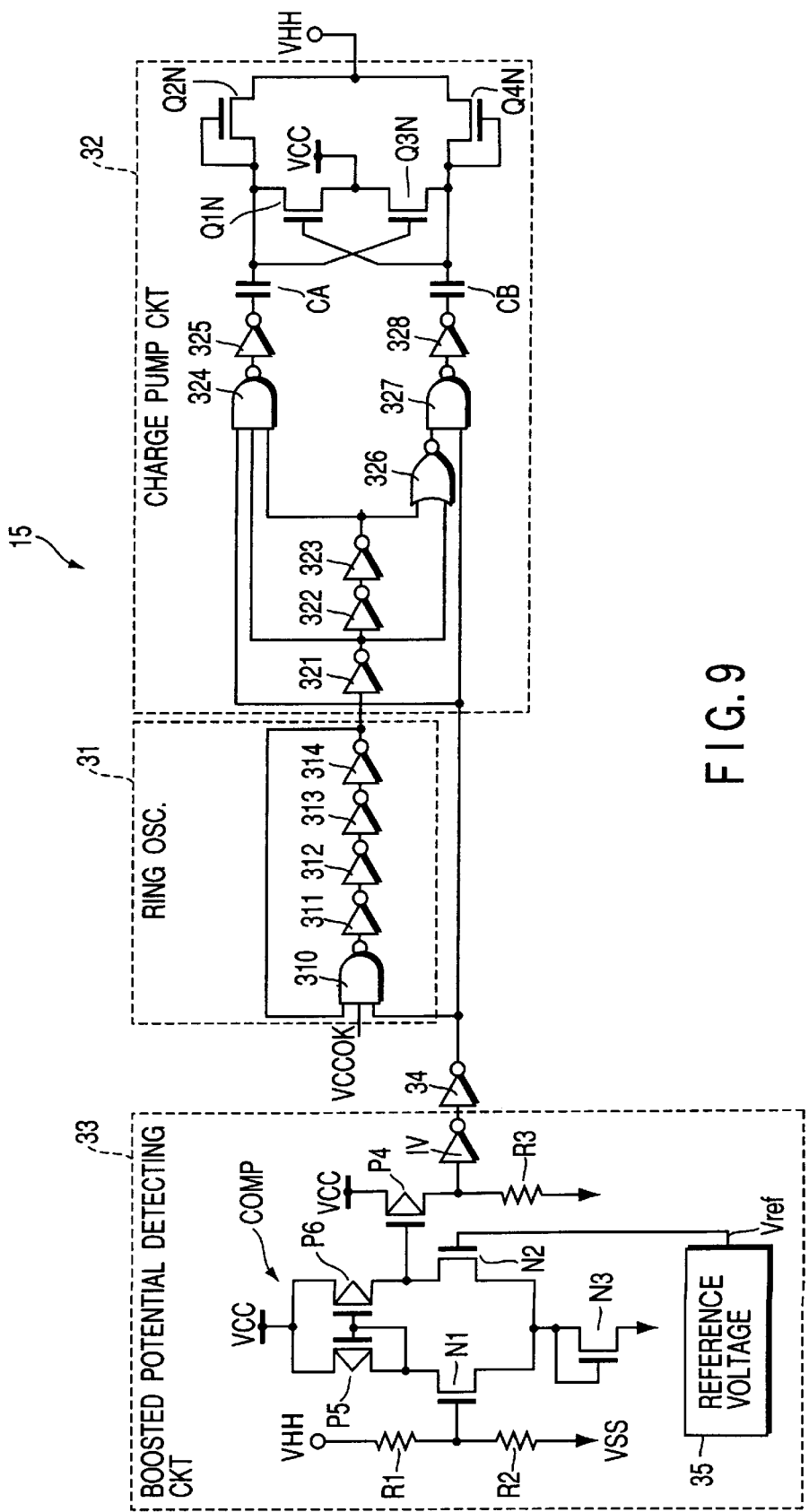
FIG. 9 shows a circuit arrangement of the VHH power supply circuit in FIG. 7.

FIG. 9 shows a specific circuit arrangement of the VHH power supply circuit 15 in FIG. 7.

The VHH power supply circuit 15 comprises a ring oscillator 31 operated from VCC, a charge pump circuit 32 operated from VCC to produce the boosted voltage VHH in response to a clock signal from the ring oscillator 31, a boosted potential sensing circuit 33 operated from VCC to detect the output voltage (VHH) of the charge pump circuit 32 having reached a specified value, and an inverter 34 responsive to the boosted potential sensing circuit 33 for controlling the operation of the ring oscillator 31 and the charge pump circuit 32.

As an example, the ring oscillator 31 is arranged such that, at the output side of a three-input NAND circuit 310, an even number of inverters, four inverters 311 to 314 in this example, is connected in cascade, and the output of the final-stage inverter 314 is fed back to an input of the NAND circuit 310. The two remaining inputs of the NAND circuit 310 are supplied with an enable control signal from the inverter 34 and the control signal VCCOK.

As an example, the charge pump circuit 32 comprises three cascade-connected inverters 321 to 323 connected to receive an output clock signal of the ring oscillator 31, a three-input NAND circuit 324 connected at its three inputs to receive outputs of the first-stage inverter 321 and the final-stage inverter 323 and a control signal to be described later, an inverter 325 for inverting the output of the NAND circuit 324, a two-input NOR circuit 326 connected at its two inputs to receive the outputs of the first-stage inverter 321 and the final-stage inverter 323, a two-input NAND circuit 327 connected at its inputs to receive the output of the NOR circuit 326 and the control signal, and an inverter 328 for inverting the output of the NAND circuit 327. The charge pump circuit further comprises a bootstrapping capacitor CA having its one terminal connected to the output of the inverter 325, a bootstrapping capacitor CB having its one terminal connected to the output of the inverter 328, an NMOS transistor Q1N having its source-drain path connected between the other terminal of the capacitor CA and the VCC node and its gate connected to the other terminal of the capacitor CB, an NMOS transistor Q2N having its drain and gate connected together to the connection point of the transistor Q1N and the capacitor CA and its source connected to the VHH node, an NMOS transistor Q3N having its source-drain path connected between the other terminal of the capacitor CB and the VCC node and its gate connected to the other terminal of the capacitor CA, and an NMOS transistor Q4N having its drain and gate connected together to the connection point of the transistor Q3N and the capacitor CB and its source connected to the VHH node.

The boosted potential detecting circuit 33 is constructed from resistors R1 and R2 connected in series between the VHH and VSS nodes, a voltage comparator COMP for comparing the voltage divided by the resistors R1 and R2 with a reference voltage Vref provided by a reference power supply 35, a PMOS transistor P4 having its gate connected to the output of the voltage comparator COMP and its source connected to the VCC node, a resistor R3 connected between the drain of the transistor P4 and the VSS node, and an inverter IV connected between the drain of the transistor P4 and the output node of the detecting circuit.

The voltage comparator COMP comprises a differential pair of NMOS transistors N1 and N2, a pair of PMOS transistors P5 and P6 connected in current mirror configuration and interposed as a load between the drains of the transistors N1 and N2 and the VCC node, and an NMOS transistor N3 connected as a current source between the common sources of the transistors N1 and N2 and the VSS node and having its drain and gate connected with each other.

In the boosted potential detecting circuit 33, the boosted voltage VHH is divided by the paired resistors R1 and R2, and the resultant voltage divided between VHH and VSS is compared with the reference voltage Vref by the voltage comparator COMP. The output of the inverter IV is at the VSS level when the boosted voltage VHH is equal to or less than a specified value and at the VCC level otherwise.

When the output voltage of the boosted potential detecting circuit 33 is VSS (namely, the output voltage of the inverter 34 is VCC), the ring oscillator 31 and the charge pump circuit 32 are enabled, otherwise they are disabled.

As a result, the VHH power supply circuit 15 of FIG. 9 operates so that the boosted voltage VHH is maintained at a specified value higher than the external supply voltage VCC.

Figure 10:
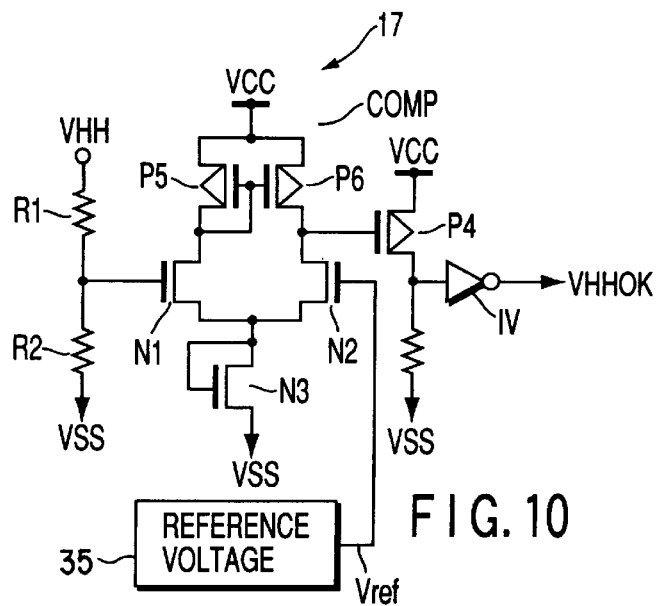
FIG. 10 shows a circuit arrangement of the VHH potential detecting circuit in FIG. 7.

FIG. 10 shows an exemplary circuit arrangement of the VHH potential detecting circuit 17 in FIG. 7. This circuit is identical in arrangement to the boosted voltage detecting circuit 33 shown in FIG. 9; thus, like reference numerals are used to denote corresponding parts to those in FIG. 9.

In the VHH potential detecting circuit 17 in FIG. 10, an intermediate voltage divided between VHH and VSS is compared with a reference voltage Vref in voltage comparator COMP. The control signal VHHOK is at the VSS level when VHH is equal to or less than a specified value and at the VCC level otherwise.

Note that the VHH potential detecting circuit 17, identical in arrangement to the boosted potential detecting circuit 33 of the VHH power supply circuit 15 shown in FIG. 9, need not be provided particularly; the boosted potential detecting circuit 33 may be used as the VHH potential detecting circuit 17 as well.

Figure 11:
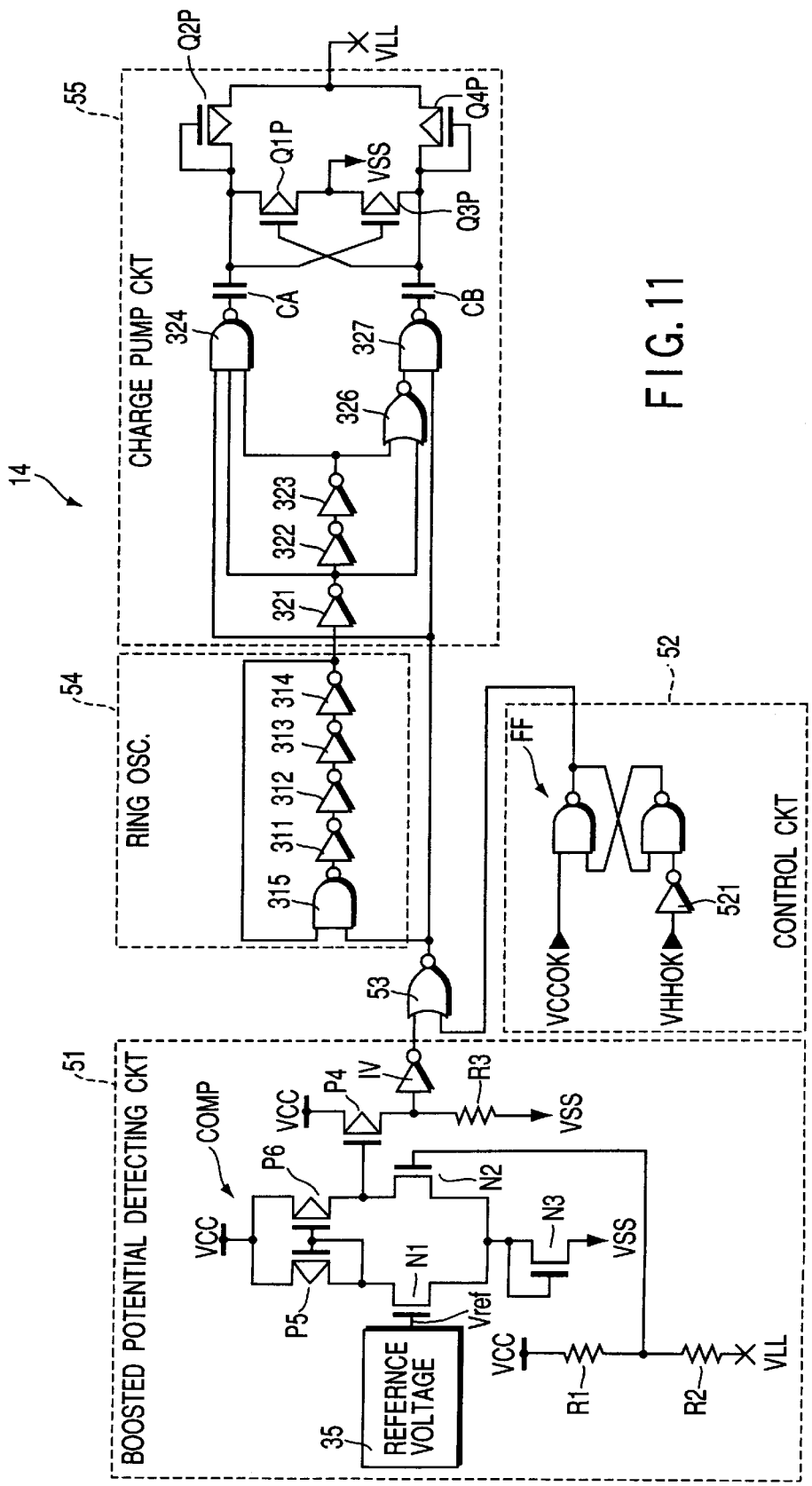
FIG. 11 shows a circuit arrangement of the VLL power supply circuit in FIG. 7.

FIG. 11 shows an exemplary circuit arrangement of the VLL power supply circuit 14 in FIG. 7. This circuit comprises a boosted potential detecting circuit 51, a control circuit 52, a ring oscillator 54, and a charge pump circuit 55.

The boosted potential detecting circuit 51 differs from the boosted potential detecting circuit 33 in the VHH power supply circuit described with reference to FIG. 9 in that, of the differential pair of NMOS transistors N1 and N2, the transistor N1 is supplied at its gate with the reference voltage Vref and the transistor N2 is supplied at its gate with the divided voltage.

The output voltage of the boosted potential detecting circuit 51 is VSS when the boosted voltage VLL is equal to or less than a specified value and VCC otherwise.

In FIG. 11, the output of the boosted potential detecting circuit 51, although being coupled to the input of the inverter 34 in the case of FIG. 9, is coupled to an input of a two-input NOR circuit 53. This NOR circuit 53 has its other input connected to receive a control signal from the control circuit 52 and its output coupled to the ring oscillator 54 and the charge pump circuit 55.

The control circuit 52 consists of a flip-flop circuit FF and an inverter 521 for inverting the control signal VHHOK from the VHH potential detecting circuit 17 in FIG. 7. The flip-flop circuit FF has its set input connected to receive the control signal VCCOK from the power-on sensing circuit 16 in FIG. 7 and its reset input connected to receive the inverted control signal /VHHOK from the inverter 521.

The control circuit 52 provides an output signal at the VSS level when the control signal VCCOK from the power-on sensing circuit 16 goes to the VCC level and the control signal VHHOK from the VHH potential detecting circuit 17 goes to the VCC level (the output of the inverter 521 goes to the VSS level).

The ring oscillator 54 differs from the ring oscillator 31 in FIG. 7 in that the three-input NAND circuit 310 is replaced with a two-input NAND circuit 315. The NAND circuit 315 has its input connected to the output of the inverter 314 and its other input connected to the output of the NOR circuit 53.

The charge pump circuit 55, adapted to produce the boosted voltage VLL having a negative value from the external supply voltage VCC, differs from the charge pump circuit 32 in FIG. 9 in that the outputs of the NAND circuits 324 and 327 are directly coupled to the bootstrapping capacitors CA and CB, respectively, with the inverters 325 and 328 omitted, PMOS transistors Q1P to Q4P are used instead of the NMOS transistors Q1N to Q4N, and the PMOS transistors Q1P and Q3P are connected with the VSS node, not the VCC node.

In the VLL power supply circuit 14 of FIG. 11, the outputs of the control circuit 52 and the NOR circuit 53 are maintained at the VCC and VSS levels, respectively, until, after power-on, the external supply voltage VCC rises to such a degree that the control signal VCCOK from the power-on sensing circuit 16 goes to the VCC level and moreover the control signal VHHOK from the VHH potential detecting circuit 17 goes to the VCC level at a result of the boosted voltage VHH going above the specified value. In this state, the ring oscillator 54 and the charge pump circuit 55 are disabled from operating.

On the other hand, when the control signal VHHOK goes to the VCC level as a result of VHH going above the specified value after the control signal VCCOK has gone to the VCC level, the output of the control circuit 52 goes to the VSS level. As a result, the output of the NOR circuit 53 comes to depend on the output of the boosted potential detecting circuit 51.

In this case, when VLL is equal to or less than the specified value, the output of the boosted potential detecting circuit 51 is at the VSS level and the output of the NOR circuit 53 is at the VCC level, enabling the ring oscillator 54 and the charge pump circuit 55 to operate. When VLL goes higher than the specified value, the output of the boosted potential detecting circuit 51 goes to the VCC level and the output of the NOR circuit 53 goes to the VSS level, so that the ring oscillator 54 and the charge pump circuit 55 stop operating. As a result, the VLL power supply circuit 14 operates so that the boosted voltage VLL is kept at a voltage lower than the specified voltage, i.e., the ground voltage VSS.

Figure 12:
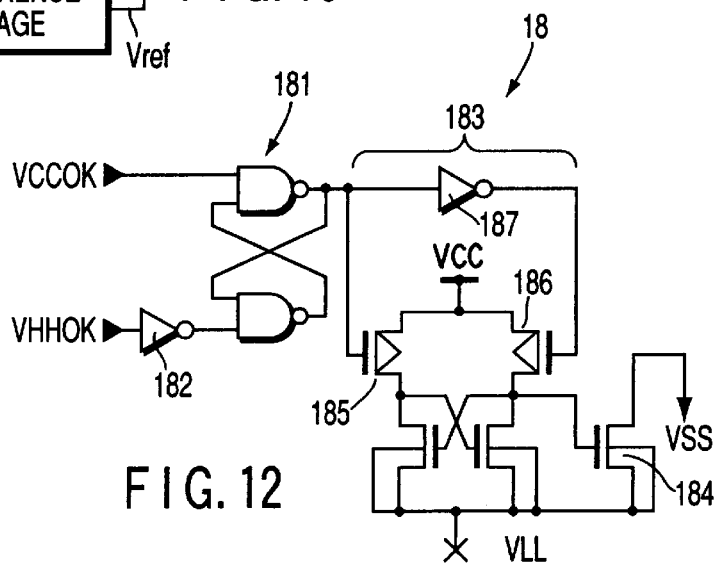
FIG. 12 shows a circuit arrangement of the VLL-VSS clamp circuit in FIG. 7.

FIG. 12 shows an exemplary circuit arrangement of the VLL-VSS clamp circuit 18 in FIG. 7. This clamp circuit 18 comprises an inverter 182 for inverting the control signal VHHOK from the VHH potential detecting circuit 17 in FIG. 7, a flip-flop circuit 181 having its set input connected to receive the control signal VCCOK from the power-on sensing circuit 16 in FIG. 7 and its reset input connected to the output signal of the inverter 182 (the complementary signal of the control signal VHHOK), a level shift circuit 183 for shifting the output level of the flip-flop circuit 181, and a VLL-VSS clamping NMOS transistor 184 having its drain-source path connected between the VSS node and the output node of the VLL power supply circuit 14 and its gate connected to the output of the level shift circuit 183.

In the level shift circuit 183, two CMOS inverters 185 and 186 having their input and output nodes cross-coupled are connected between the VCC and VLL nodes and each of NMOS transistors in the CMOS inverters has its substrate region (backgate) connected to the VLL node. Of the two CMOS inverters, the CMOS inverter 185 is connected at the gate of its PMOS transistor to the output of the flip-flop circuit 181. The other CMOS inverter 188 is connected at the gate of its PMOS transistor to an output of an inverter 187 connected to the output of the flip-flop circuit 181. The output of the CMOS inverter 186 is connected to the gate of the VLL-VSS clamping NMOS transistor 184.

The VLL-VSS clamp circuit 18 of FIG. 12 is controlled by the control signal VCCOK from the power-on sensing circuit 16 and the control signal VHHOK from the VHH potential detecting circuit 17 as follows:

Until, after power-on, VCC rises to such a degree that the control signal VCCOK from the power-on sensing circuit 16 goes to VCC and moreover the control signal VHHOK from the VHH potential detecting circuit 17 goes to VCC at a result of VHH going above the specified value, the output of the flip-flop circuit 181 is maintained at VCC, the output of the level shift circuit 183 is maintained at VCC, the clamping transistor 184 is ON, the output node of the VLL power supply circuit 14 is short-circuited to the VSS node, and the output voltage of the VLL power supply circuit is clamped to VSS.

On the other hand, when the control signal VHHOK goes to VCC as a result of VHH going above the specified value after the control signal VCCOK has gone to VCC, the output of the flip-flop circuit 181 goes to VSS, the output of the level shift circuit 183 goes to VLL, the clamping transistor 184 turns OFF, and the output of the VLL power supply circuit 14 is released from the clamped state. After that, this state continues.

Figure 13:
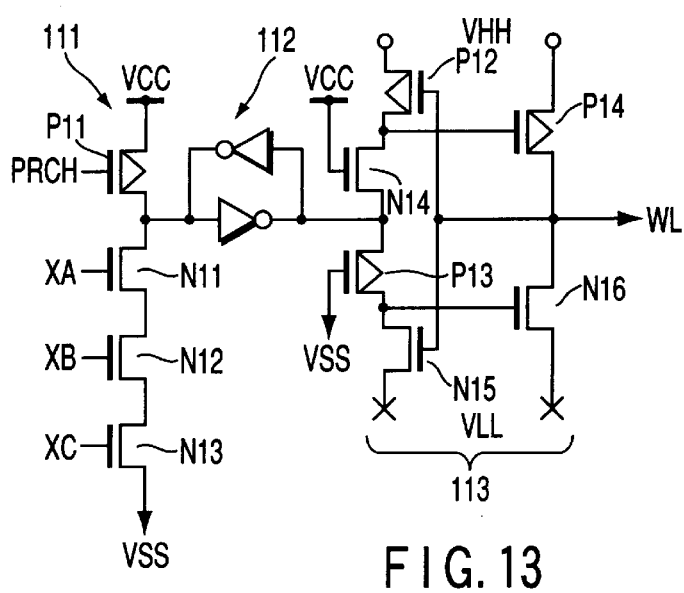
FIG. 13 shows a circuit arrangement of part of the row decoder in FIG. 6 for one word line.

FIG. 13 shows an example of a circuit arrangement of the row decoder 11 of FIG. 6, typically the arrangement for one word line WL.

The row decoder is composed of a row decode circuit (word line select circuit) 111, a latch circuit 112, and a word line driver 113.

The row decode circuit 111 consists of a precharge/discharge type of NAND circuit which is connected between the VCC and VSS nodes and comprises a series combination of a precharging PMOS transistor P11 and three discharging NMOS transistors N11 to N13 adapted to decode internal address signals. The connection point of the PMOS transistor P11 and the group of the NMOS transistors N11 to N13 forms the output node of the decode circuit.

In the row decode circuit 111, first, the PMOS transistor P11 is turned on for the active interval of a precharge signal PRCH during which it is high to thereby precharge the output node to the high level. The output node is then pulled down to the low level when all the inputs of the three NMOS transistors N11 to N13 (internal address signals XA, XB and XC) go high.

The latch circuit 112, consisting of two CMOS inverters in antiparallel connection, latches an row decode output.

The word line drive circuit 113 comprises a series combination of a PMOS transistor P12, an NMOS transistor N14 having its gate connected to the VCC node, a PMOS transistor P13 having its gate connected to the VSS node, and an NMOS transistor N15 and another series combination of a drive PMOS transistor P14 and a pull-down (noise canceling) NMOS transistor N16. Each of the series combinations is connected between the VHH and VLL nodes.

The output node of the latch circuit 112 is connected to the input node of the word line drive circuit 113, i.e., the common sources of the NMOS transistor N14 having its gate connected to the VCC node and the PMOS transistor P13 having its gate connected to the VSS node. The gates of the PMOS transistor P12 and the NMOS transistor N15 are connected together to the output node of the word line driver 113, i.e., the common drains of the PMOS transistor P14 and the NMOS transistor N16.

In the row decoder of FIG. 13, therefore, in the precharged state where no word line is selected, the output of the row decode circuit 111 is at the high level, the output of the latch circuit 112 is at the low level, the drive transistor P14 is off, and the pull-down transistor N16 is on. In this state, the VLL potential is applied to the word line WL connected to the output of the word line drive circuit 113.

On the other hand, in the selected state where all the internal address signals XA, XB and XC are high, the output of the row decode circuit 111 goes to the low level, the output of the latch circuit 112 goes to the high level, the drive transistor P14 turns on, and the pull-down transistor N16 turns off, thereby setting the word line WL at the VHH potential.

FIG. 14 shows operating waveforms at power-on time of the power supply circuit system in the DRAM shown in FIG. 7. The operation of the power supply circuit system will be described below with reference to FIG. 14.

First, at power-on time, the external supply voltage VCC rises up to an operating voltage in a certain period of time. During the interval when VCC is below a certain specified value, the VLL-VSS clamp circuit 18 is responsive to the control signal VCCOK at the VSS level from the power-on sensing circuit 16 to perform a clamping operation, whereby the VLL node and the VSS node are short-circuited.

With this state held, the VHH power supply circuit 15 commences a boosting operation. The boosted voltage VHH rises gradually and then goes higher than the external supply voltage VCC. When the boosted voltage VHH has reached a specified value, the VHH potential detecting circuit 17 outputs the control signal VHHOK at the VCC level, releasing the VLL-VSS clamp circuit 18 from clamping. The VLL power supply circuit 14 is allowed to start a boosting operation.

The boosted voltage VLL falls gradually (rises in the negative direction). The boosted voltage VLL upon reaching a specified value enables the row decoder 11 to perform a word line drive operation based on the NWL driving technique.

That is, according to the NWL driving-based DRAM according to the first embodiment, at the start of power-on, the operation of the VHH power supply circuit 15 is commenced with the VLL power supply circuit 14 held at the VSS level.

When VHH rises as the external supply voltage VCC rises, the potentials at the internal signal lines of the row decoder 11 become indeterminate or are placed in a transition state. Particularly, when VHH is of the order of the threshold voltage of NMOS transistors, a through-current flows from the VHH power supply circuit 15 to the VLL power supply circuit 14; thus, it is required for the VHH power supply circuit 15 to have a current supply capacity sufficient to compensate for that through-current. At this point, the through-current is compensated for by the VLL-VSS clamp circuit 18 and VLL is fixed at the VSS level, namely, 0 V.

Upon reaching the specified value above VCC, VHH becomes stabilized. After VHH has reached the specified value, the clamped state where the VLL node is short-circuited to the VSS node by the VLL-VSS clamp circuit 18 is released, so that the operation of the VLL power supply circuit 14 is commenced.

When VHH is in the stable state, the potentials at internal signal lines of the row decoder 11 are also stabilized and current dissipation is very small. It is therefore not required for the VLL power supply circuit 14 to have so large a current supply capacity as to be required with the VHH power supply circuit 15. Furthermore, since the VHH power supply circuit 15 and the VLL power supply circuit 14 can be displaced in power-on time, it is not required to consider the balance of current supply capacity between them. It therefore becomes possible to complete the operation of turning on power to the DRAM with stability.

FIG. 15 is a schematic representation of an NWL driving-based DRAM according to a second embodiment of the present invention. FIG. 16 is a block diagram of the power supply system used in the DRAM of FIG. 15.

This DRAM adopts a Vt CMOS technique in addition to the NWL driving method. The Vt CMOS technique is one that suppresses the cutoff current of MOS transistors and ensures that their standby current is reduced by controlling the backgate voltage of the MOS transistors.

The DRAM shown in FIGS. 15 and 16 is substantially the same as that in the first embodiment described previously except the following points:

(1) A VHH power supply circuit 91 is a dropping power supply circuit that produces a voltage lower than the external supply voltage VCC and is arranged as shown in FIG. 17 by way of example.

(2) A control circuit 90 is provided. The dropping voltage VHH which is generated from the VHH power supply circuit 91 is supplied to the circuit 90. This control circuit 90 includes a row address buffer to which row address signals are input, a column address buffer to which column address signals are input, an input buffer to which various control signals are input, and an input/output buffer from which data signals are input or output. The row address buffer sends internal row address signals to the row decoder 11a. The column address buffer applies internal column address signals to the column decoder 13. The input buffer provides various control signals to internal circuits. The input/output buffer sends or receives data signals to or from the sense amplifier/column switch circuit 12a.

(3) The row decoder 11a is identical in circuit arrangement to the row decoder shown in FIG. 13 but differs in supply voltage.

(4) The sense amplifier/column switch circuit 12a and the row decoder 13a are identical in circuit arrangement to the sense amplifier/column switch circuit 12 and the row decoder 13, respectively, of FIG. 6 but differ in supply voltage.

(5) A VHH potential detecting circuit 17a is identical in circuit arrangement to that shown in FIG. 10 but differs in supply voltage and potential to be detected.

(6) Most of CMOS logic circuits used in the memory cell array 10, the sense amplifier/column switch circuit 12a, the column decoder 13a and the control circuit 90 are Vt CMOS logic circuits in which the sources and backgates of MOS transistors are supplied with various voltages as shown in FIG. 18 by way of example.

Figure 19:
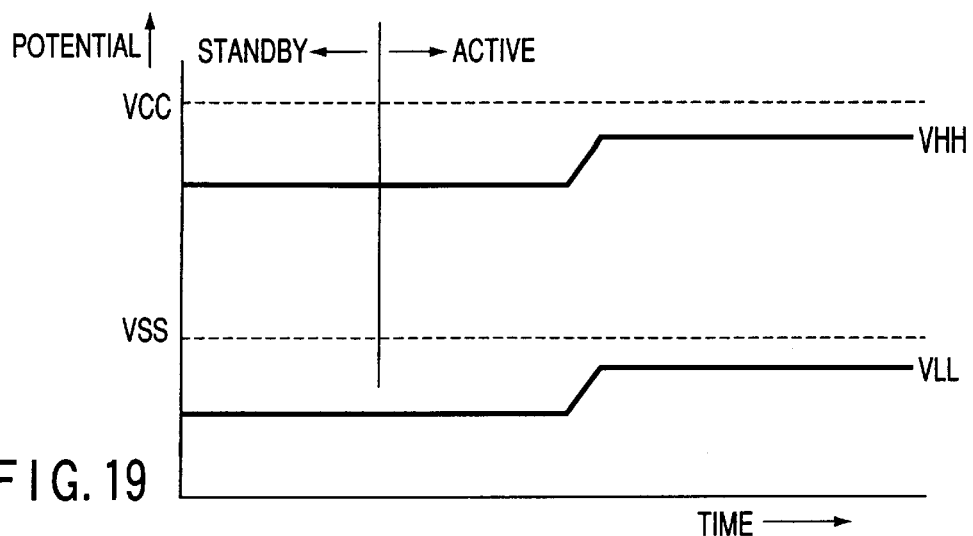
FIG. 19 shows variations in voltages VHH and VLL applied to the CMOS logic circuits of FIG. 18.

(7) As shown in FIG. 19, the voltages VHH and VLL which are applied to the sources and the backgates of PMOS and NMOS transistors, respectively, are each controlled to vary between active and standby sates of CMOS logic circuits.

The VHH power supply circuit 91 shown in FIG. 17 is comprised of resistors R11 and R12 connected in series between the VHH node from which dropped voltage VHH is output and the VSS node, a voltage comparator 100 for comparing the voltage at the connection point of the resistors R11 and R12 with a reference voltage Vref2, and a PMOS transistor P14 having its gate connected to the output of the voltage comparator, its source connected to the VCC node and its drain connected to the VHH output node.

The voltage comparator 100 is composed, for example, of a differential pair of NMOS transistors N11 and N12, a pair of PMOS transistors P15 and P16 connected in current mirror configuration and interposed as a load between the drains of the transistors N11 and N12 and the VCC node, and an NMOS transistor N13 interposed as a current source between the common sources of the transistors N11 and N12 and the VSS node and having its drain and gate connected together.

In the VHH power supply circuit 91 thus arranged, the dropped voltage VHH at the VHH output node is resistance divided and the resultant divided voltage is compared in the voltage comparator 100 with the reference voltage Vref2. The gate of the PMOS transistor P14 is controlled by the comparator output so that the dropped voltage VHH is maintained at a specified value.

In the Vt CMOS logic circuit shown in FIG. 18, for example, two CMOS inverters are connected in cascade. In each CMOS inverter, an NMOS transistor QN has its source connected to the VSS node and a PMOS transistor QP has its source connected to the VHH node. The drains of these transistors are connected together. The NMOS transistor QN has its backgate connected to VLL and the PMOS transistor QP has its backgate connected to VCC.

As shown in FIG. 19, in the active state of the Vt CMOS logic circuit, VHH is set higher than in the standby state. The same is true for VLL. Thus, the supply voltage of the CMOS logic circuit is raised and the backgate bias of each of NMOS and PMOS transistors becomes shallow, which reduces the threshold voltage of the transistors and allows for fast circuit operation.

In other words, in the standby state of the CMOS logic circuit shown in FIG. 18, the backgate voltage VHH of the PMOS transistors and the backgate voltage VLL of the NMOS transistors are each set lower than in the active state. Thereby, the supply voltage of the CMOS logic circuit is lowered and the backgate bias of each of the NMOS and PMOS transistors becomes deep; thus, the threshold voltage of each transistor is increased, allowing standby current to be reduced.

Figure 20:
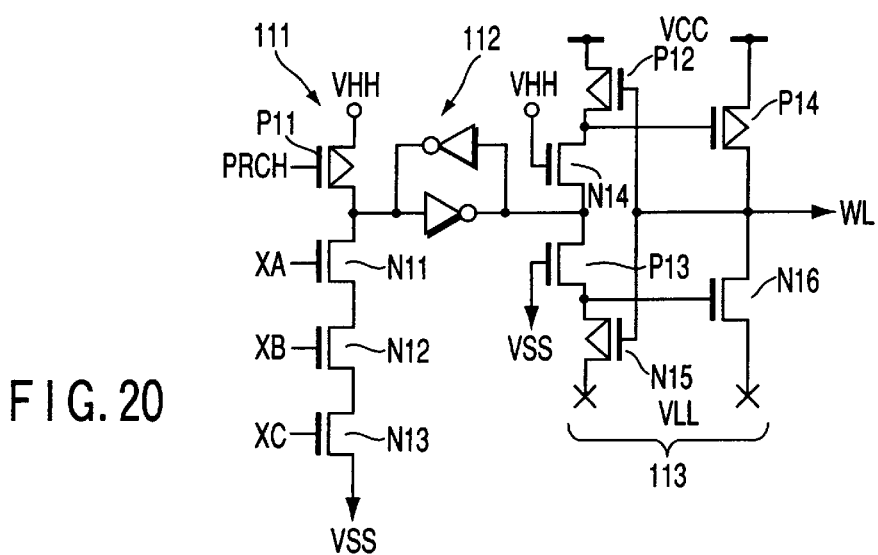
FIG. 20 shows a circuit arrangement of part of the row decoder in FIG. 15 for one word line.

FIG. 20 shows an example of a circuit arrangement of the row decoder 11a of FIG. 15, typically the arrangement for one word line WL.

This row decoder is identical in circuit arrangement to that shown in FIG. 13 and hence like reference numerals are used to denote corresponding parts to those in FIG. 13. The row decoder of FIG. 20 is distinct from the row decoder of FIG. 13 in that VHH and VSS are used as the operating supply voltages of the precharge/discharge NAND gate 111 and the latch circuit 112, VCC and VLL are used as the operating supply voltages of the word line drive circuit 113, VHH is applied to the gate of the NMOS transistor N14, and VSS is applied to the gate of the PMOS transistor P13.

Figure 21:
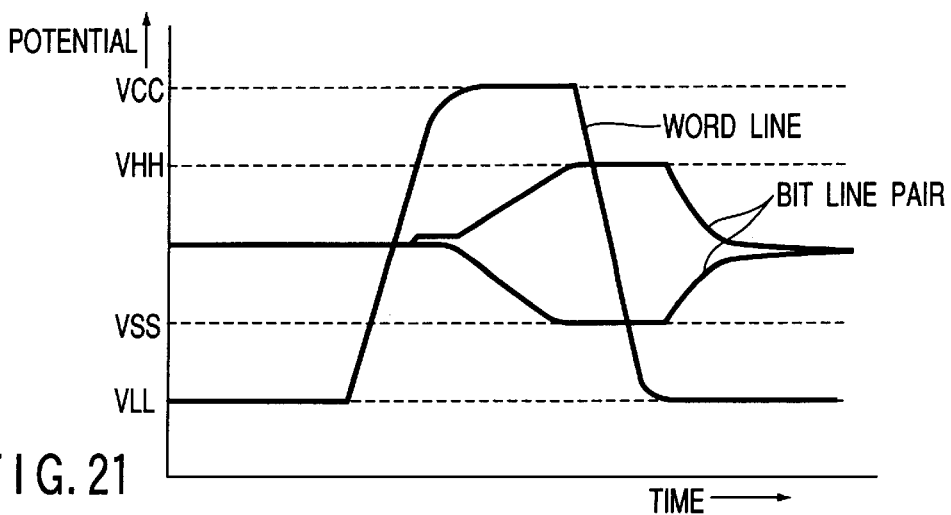
FIG. 21 shows voltage waveforms illustrating the operation of the row decoder of FIG. 20 by NWL driving.

FIG. 21 is a diagram for use in explanation of the operation of the row decoder of FIG. 20 using the NWL driving technique. The potential on the word line WL is VLL in the non-selected state and VCC in the selected state. The potentials on the paired bit lines BL and /BL make a transition from VSS higher than VLL to VHH lower than VCC and vice versa.

FIG. 22 shows operating waveforms at power-on time of the power supply system of the DRAM shown in FIG. 16. At power-on time, the external supply voltage VCC rises up to an operating voltage in a certain period of time. During the interval when VCC is below a certain specified value, the VLL-VSS clamp circuit 18 is responsive to the control signal VCCOK at the VSS level from the power-on sensing circuit 16 to perform a clamping operation, whereby the VLL node and the VSS node are short-circuited.

With this state held, the VHH power supply circuit 91 commences a boosting (dropping) operation. When the dropped voltage VHH rises gradually and reaches a specified value lower than VCC, the VHH potential detecting circuit 17a outputs the control signal VHHOK at the VCC level, releasing the VLL-VSS clamp circuit 18 from clamping. The VLL power supply circuit 14 is allowed to start a boosting operation.

The boosted voltage VLL falls gradually (rises in the negative direction). The boosted voltage VLL upon reaching a specified value enables the row decoder 11a to perform a word line drive operation based on the NWL driving technique.

That is, according to the DRAM using the NWL driving and Vt CMOS techniques according to the second embodiment, at the start of power-on, the operation of the VHH power supply circuit 15 is commenced with the VLL power supply circuit 14 short-circuited to the external supply voltage VSS.

When VHH rises as the external supply voltage VCC rises, the internal signals and output signals of the CMOS logic circuits operated from VHH and VSS also make transitions, resulting in an increase in current dissipation. Particularly, when VHH is of the order of the threshold voltage of NMOS transistors, a through-current flows from the VHH power supply circuit 15 to the VLL power supply circuit 14 to further increase current dissipation; thus, it is required for the VHH power supply circuit 91 to have a current supply capacity sufficient to compensate for that through-current. In this case, since the VHH power supply circuit 91 is a dropped power supply, it is possible to form a power circuit that has a required current supply capacity with a relatively small pattern area occupied in integrated circuits.

Although the through-current and the charge/discharge current produced in the row decoder 11a flow in the VLL power supply circuit 14, these currents are compensated for by the VLL-VSS clamp circuit 18 and VLL is fixed at about VSS, namely, 0 V.

After VHH has reached the specified value, the clamped state where the VLL node is short-circuited to the VSS node by the VLL-VSS clamp circuit 18 is released, so that the operation of the VLL power supply circuit 14 is commenced.

When VHH is in the stable state, the potentials at internal signal lines of the row decoder 11 are also stabilized and current dissipation is very small. It is therefore not required for the VLL power supply circuit 14 to have so large a current supply capacity as to be required with the VHH power supply circuit 91. Therefore, it becomes possible to avoid a phenomenon in which, at power-on time, VLL rises abnormally and to complete the operation of turning on power to the DRAM with stability.

For better understanding of the aforementioned effectiveness, problems that will arise in the absence of the VLL-VSS clamp circuit 18 will be described here.

Figure 1:
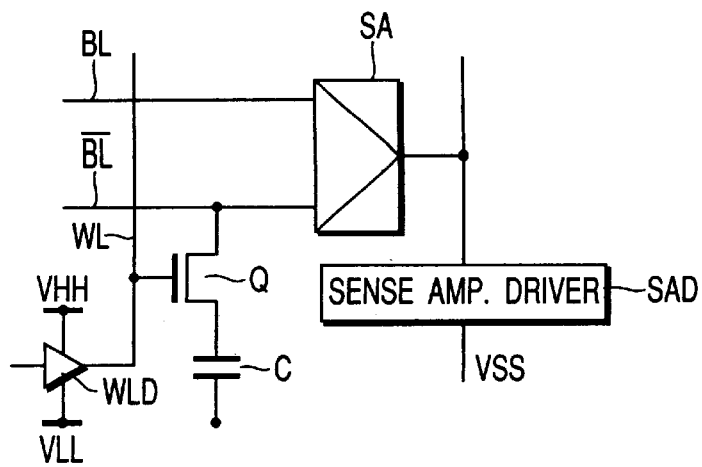
FIG. 1 shows a circuit arrangement of part of a conventional DRAM adopting an NWL driving technique.
Figure 2:
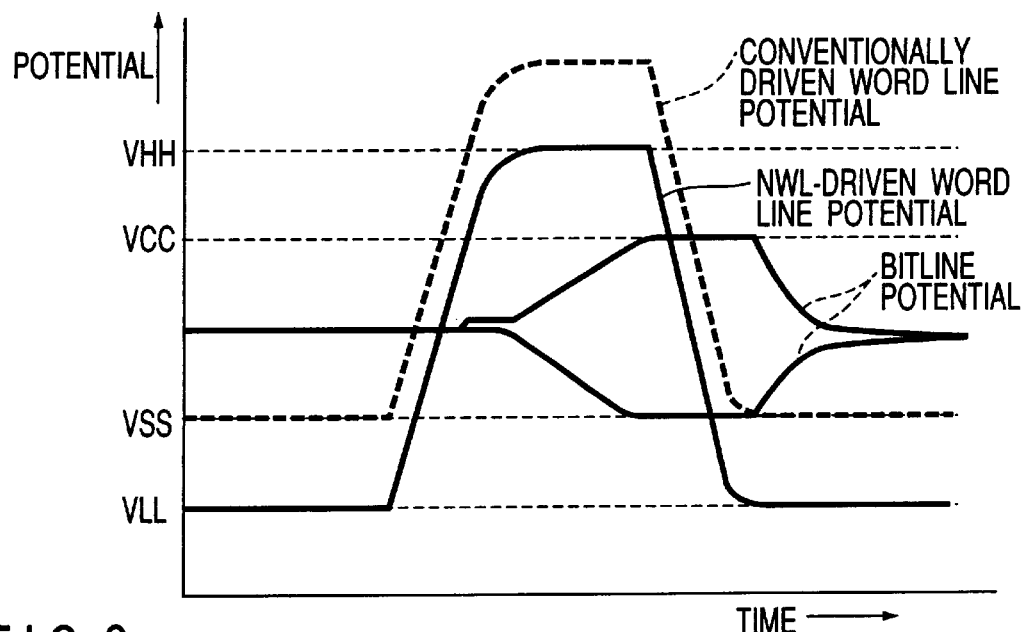
FIG. 2 shows exemplary waveforms of potentials on word and bit lines in the DRAM of FIG. 1.
Figure 4:
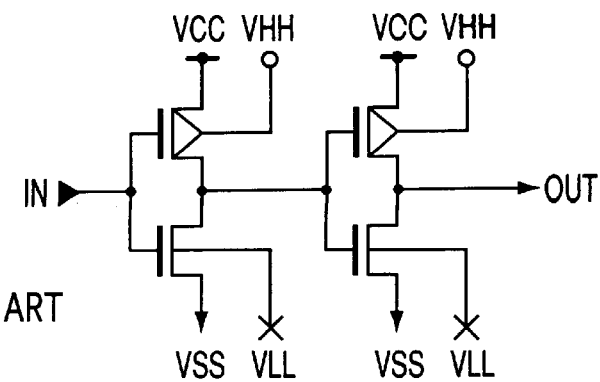
FIG. 4 shows a circuit arrangement of a conventional Vt CMOS logic circuit to which a Vt CMOS technique is applied.
Figure 3:
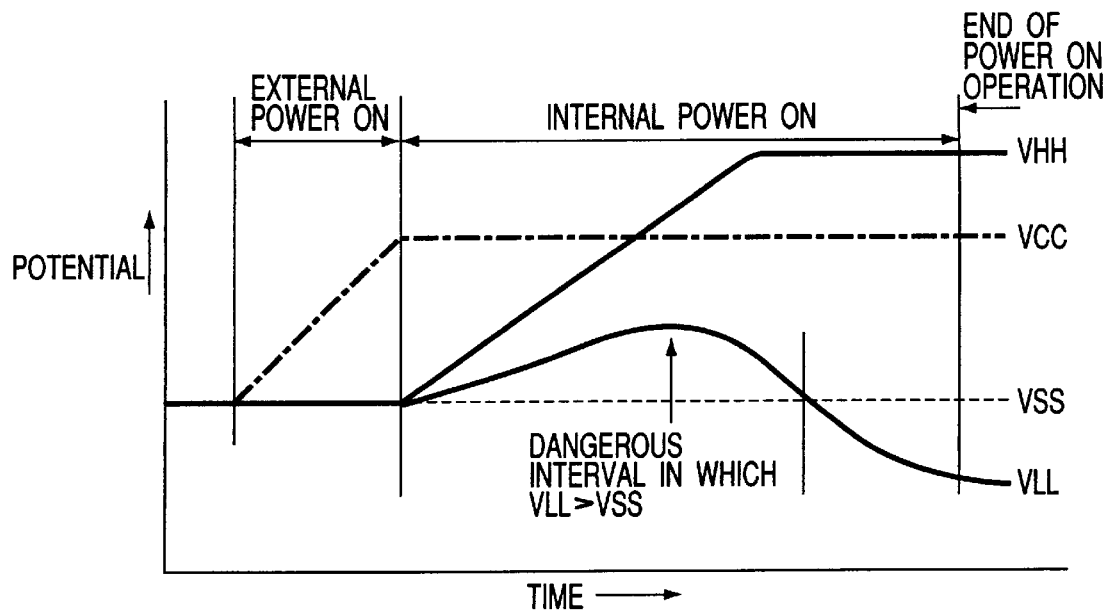
FIG. 3 shows variations in supply potential at power-on time in the DRAM of FIG. 1.
Figure 5:
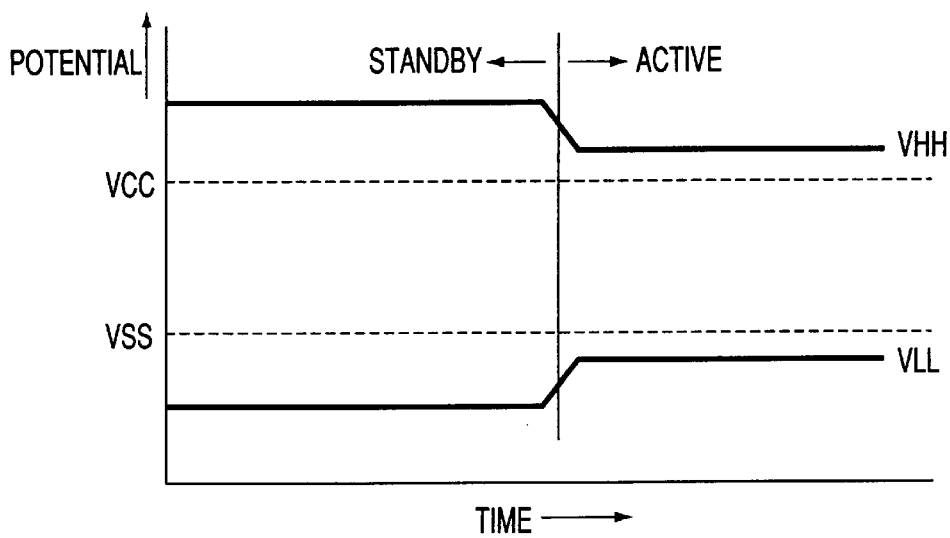
FIG. 5 shows variations in voltages VHH and VLL applied to the CMOS logic circuit of FIG. 4.

In the absence of the VLL-VSS clamp circuit 18, a large current produced at power-on time in the VLL power supply circuit 14 has to be compensated for by it. In general, a boosting power supply is less efficient than a dropping power supply and requires a larger pattern area. Thus, to implement a VLL power supply circuit (boosting power supply) having a required current supply capacity, a larger pattern area will be required. An insufficient current supply capacity of the VLL power supply circuit would result in an unfavorable situation where VLL goes higher than VSS as shown in FIG. 3.

Figure 23:
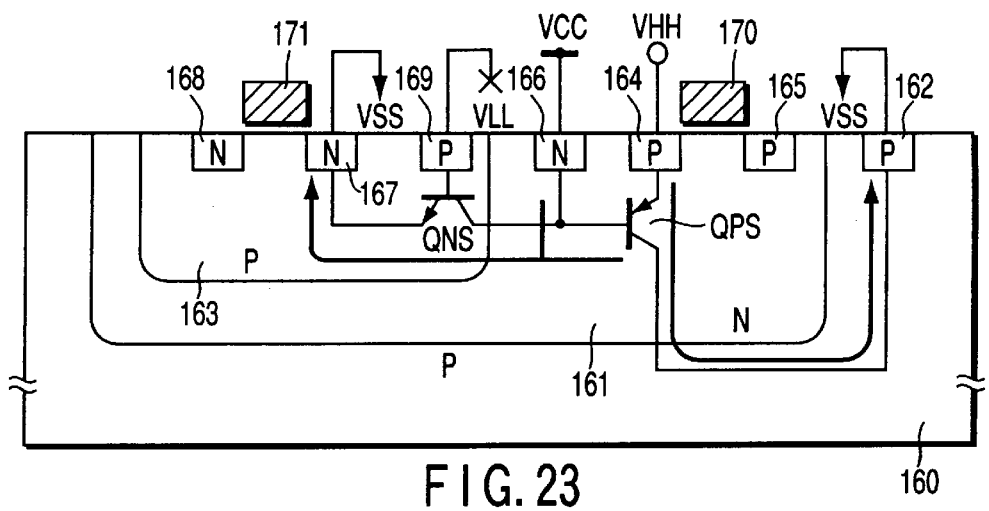
FIG. 23 is a sectional view illustrating the structure of a CMOS logic circuit in FIG. 18.

The CMOS logic circuits have such a sectional structure as shown in FIG. 23. A parasitic bipolar transistor is present in the CMOS logic circuit. That is, in FIG. 23, an N-well 161 and a P-type region 162 serving as a substrate electrode are formed in the surface of a P-type semiconductor substrate 160. A P-well 163 is formed in the surface of the N-well 161.

In the surface of the N-well 161 are formed P-type regions 164 and 165 serving as the source and drain, respectively, of a PMOS transistor and an N-type region 166 serving as an electrode of that N-well 161.

In the surface of the P-well 163 are formed N-type regions 167 and 168 serving as the source and drain, respectively, of an NMOS transistor and a P-type region 169 serving as an electrode for that P-well 163.

A gate electrode 170 is formed over the channel region of the PMOS transistor between its source and drain regions 167 and 168 with an gate insulating film (not shown) interposed therebetween. Likewise, a gate electrode 171 is formed over the channel region of the NMOS transistor.

The source region 164 of the PMOS transistor is supplied with VHH, the N-type region 166 serving as the N-well electrode (the backgate of the PMOS transistor) is supplied with VCC, the source region 167 of the NMOS transistor is supplied with VSS, the P-type region 169 serving as the P-well electrode (the backgate of the NMOS transistor) is supplied with VLL, and the P-type region 162 serving as the substrate is supplied with VSS.

With this structure, a parasitic bipolar transistor (NPN transistor QNS) is formed with the N-well 161 as collector, the P-type region 169 as base, and the source region 167 as emitter. Also, a parasitic bipolar transistor (PNP transistor QPS) is formed with the source region 164 as collector, the N-well 161 as base, and the P-type semiconductor substrate 160 as emitter.

Since the boosted, negative voltage VLL is applied to the backgate of the NMOS transistor of the above CMOS logic circuit, if VLL goes higher than VSS at power-on time, the parasitic bipolar transistor (NPN transistor QNS) will be forward biased. As a result, a large current flows through a path indicated by a bold arrow, i.e., from the N-type region 166 (VCC node) to N-type source region 167 (VSS node) in the N-well 161.

In the worst case, large current in the parasitic bipolar transistor (NPN transistor QNS) will trigger base current flow in the parasitic bipolar transistor (PNP transistor QPS). A large current will flow this time between the VHH and VSS nodes as indicated by a bold arrow, which induces latchup. The latchup may lead to breakdown of the device.

According to the embodiments described so far, however, the VLL node has been clamped to the VSS node by the VLL-VSS clamp circuit 18 immediately after power-on and consequently VLL has been set equal in magnitude to VSS. For this reason, the parasitic bipolar transistor (NPN transistor QNS) is disabled from operating and hence no current will flow between the VCC and VSS nodes. In addition, no current will flow between the VHH and VSS nodes and hence the latchup as mentioned above will not occur. Therefore, the device is protected from breakdown.

Figure 24:
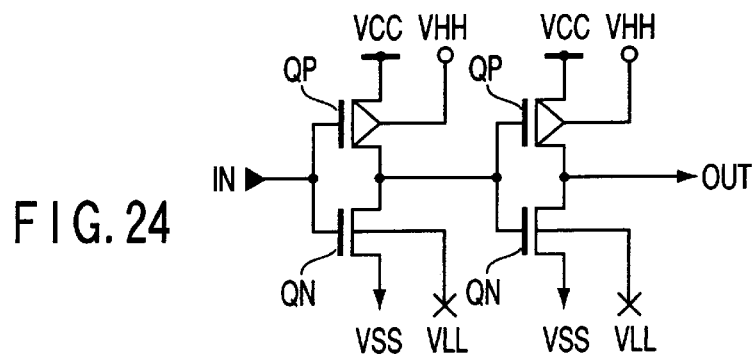
FIG. 24 shows the circuit arrangement of CMOS logic circuits using the Vt CMOS technique in the first embodiment.

FIG. 24 shows the arrangement of CMOS logic circuits when the Vt CMOS technique is used in the first embodiment. This CMOS logic circuit is used in the memory cell array 10, the sense amplifier/column switch circuit 12, and the column decoder 13. As shown, in each CMOS logic circuit, a PMOS transistor QP has its source connected to VCC and its backgate connected to VHH higher than VCC, whereas a NMOS transistor NP has its source connected to ground potential, VSS, and its backgate connected to VLL lower than VSS.

Figure 25:
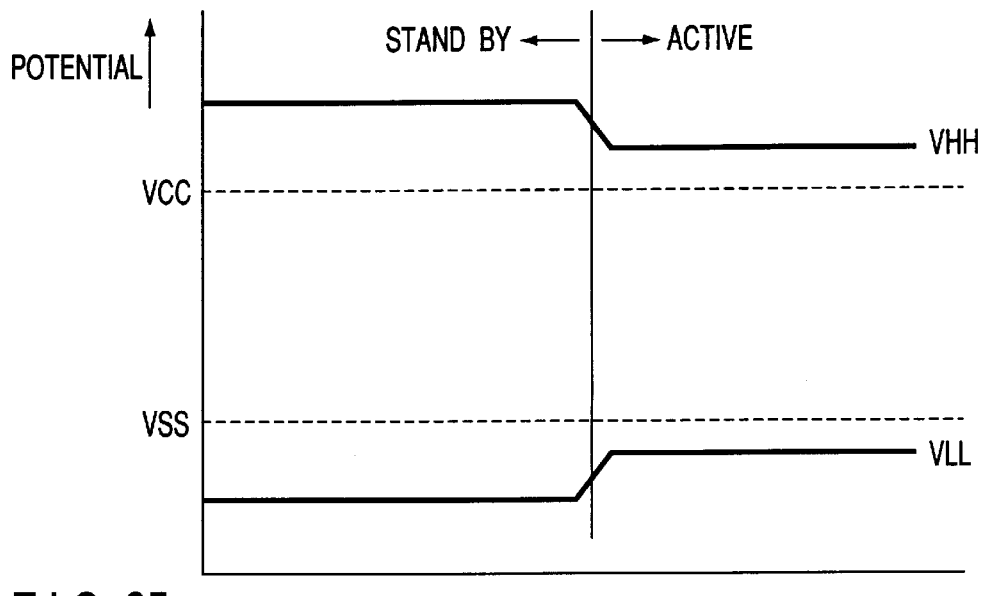
FIG. 25 shows variations in voltages VHH and VLL applied to the CMOS logic circuits of FIG. 24.

As shown in FIG. 25, the voltages VHH and VLL which are applied to the backgates of PMOS and NMOS transistors, respectively, are each controlled to vary between active and standby sates of CMOS logic circuits.

That is, in the standby state of the Vt CMOS logic circuit, VHH is set higher than in the active state. Conversely, VLL is set lower. Thus, the backgate of each of NMOS and PMOS transistors is biased deep in the standby state, which increases the threshold voltage of each transistor and allows the standby current to be reduced.

Although the first and second embodiments have been described as the VLL power supply circuit 14 producing the internal supply voltage VLL lower than ground voltage VSS, the VLL power supply circuit 14 may be arranged to produce an internal supply voltage, VLL, that is higher than VSS but lower than the external supply voltage VCC.

FIG. 26 is a block diagram of the power supply circuit system in a DRAM according to a third embodiment of the present invention. This power supply circuit differs from that in the first embodiment shown in FIG. 7 in that, instead of the VLL power supply circuit 14 of FIG. 7, a VLL power supply circuit 19 is provided which is arranged to produce an internal supply voltage, VLL, that is higher than VSS but lower than VCC. Like the VHH power supply circuit 15, this VLL power supply circuit 19 consists of a boosting circuit equipped with a charge pump circuit. As in the case of FIG. 7, the VHH power supply circuit 15 in FIG. 26 is adapted to produce from the external supply voltage VCC an internal supply voltage, VHH, which is higher than VCC.

In FIG. 27 are illustrated the operating waveforms in the DRAM that operates with the internal supply voltages VHH and VLL produced by such circuits and the eternal supply voltages VCC and VSS. As shown, the bit line potentials vary between VCC and VLL. The word line potential is at the VSS level in non-selected state and at the VHH level in selected state.

In this embodiment, most of CMOS logic circuits used in the memory cell array 10, the sense amplifier/column switch circuit 12 and the column decoder 13 are supplied with VCC and VLL as operating supply voltages to conform to the bit line potentials.

FIG. 28 shows the arrangement of CMOS logic circuits when the Vt CMOS technique is used in the third embodiment. As shown, in each CMOS logic circuit, a PMOS transistor QP has its source connected to VCC and its backgate connected to VHH higher than VCC, whereas an NMOS transistor NP has its source connected to VLL higher than VSS but lower than VCC and its backgate connected to VSS.

Figure 29:
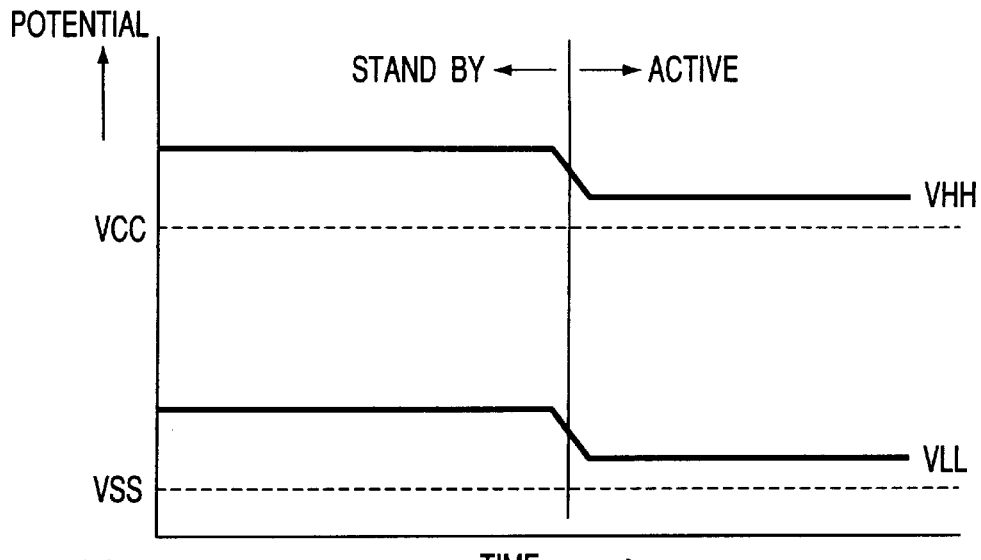
FIG. 29 shows variations in voltages VHH and VLL applied to the CMOS logic circuits of FIG. 28.

As shown in FIG. 29, the voltage VHH applied to the backgates of PMOS transistors and the voltage VLL applied to the sources of NMOS transistors are each controlled to vary between active and standby sates of CMOS logic circuits.

That is, in the standby state of the Vt CMOS logic circuit, VHH and VLL are set higher than in the active state. Thus, the backgate of each of NMOS and PMOS transistors is biased deep in the standby state, which increases the threshold voltage of each transistor and allows the standby current to be reduced.

Figure 30:
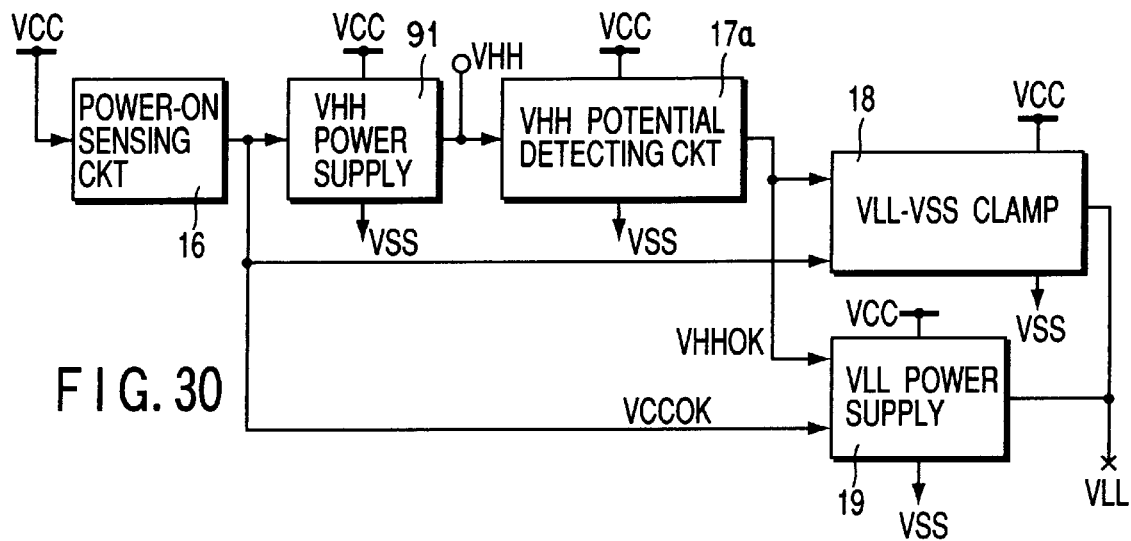
FIG. 30 is a block diagram of the power supply system of a DRAM according to a fourth embodiment of the present invention.

FIG. 30 is a block diagram of the power supply circuit system in a DRAM according to a fourth embodiment of the present invention. This power supply circuit differs from that in the second embodiment shown in FIG. 16 in that, instead of the VLL power supply circuit 14 of FIG. 16, a VLL power supply circuit 19 is provided which is arranged to produce an internal supply voltage, VLL, that is higher than VSS but lower than VCC. Like the VHH power supply circuit 15, this VLL power supply circuit 19 consists of a boosting circuit equipped with a charge pump circuit. As in the case of FIG.

16, the VHH power supply circuit 91 in FIG. 30 is a dropping circuit adapted to produce from the external supply voltage VCC an internal supply voltage, VHH, which is lower than VCC.

In this embodiment, most of CMOS logic circuits used in the memory cell array 10, the sense amplifier/column switch circuit 12 and the column decoder 13 are supplied with VHH and VLL as operating supply voltages.

Figure 31:
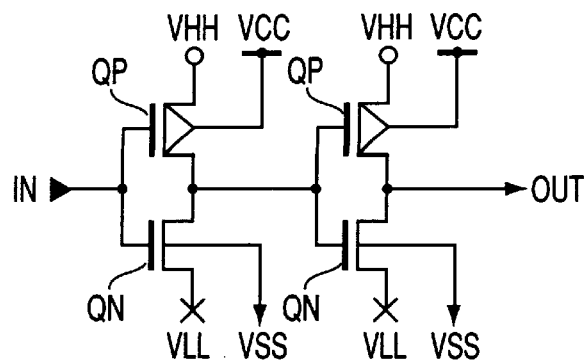
FIG. 31 shows the circuit arrangement of CMOS logic circuits using the Vt CMOS technique in the fourth embodiment.

FIG. 31 shows the arrangement of CMOS logic circuits when the Vt CMOS technique is used in the fourth embodiment. As shown, in each CMOS logic circuit, a PMOS transistor QP has its source connected to VHH and its backgate connected to VCC, whereas an NMOS transistor NP has its source connected to VLL higher than VSS but lower than VCC and its backgate connected to VSS.

Figure 32:
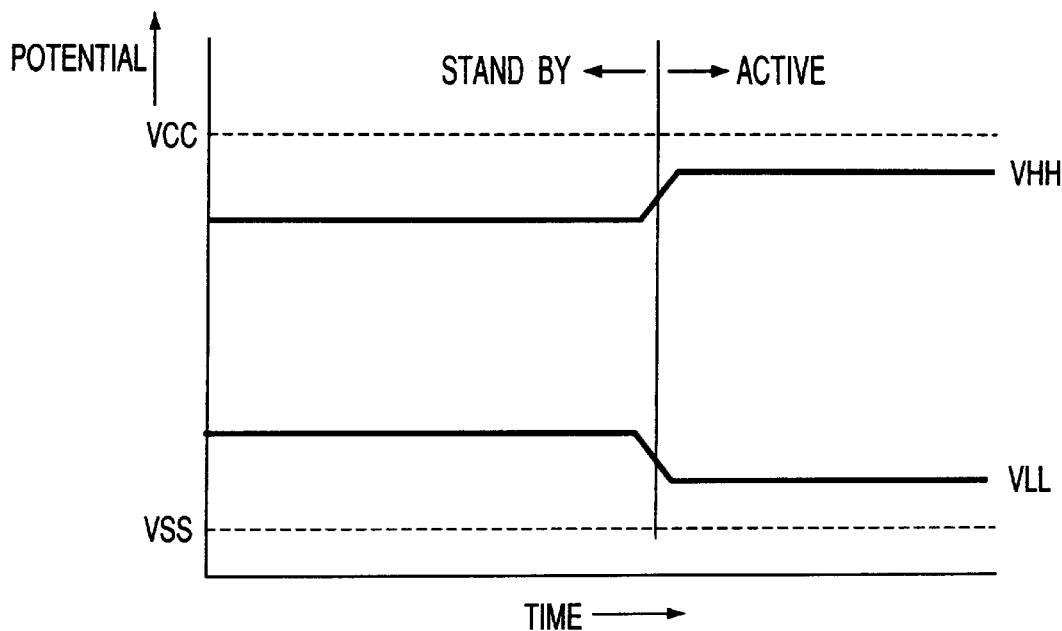
FIG. 32 shows variations in voltages VHH and VLL applied to the CMOS logic circuits of FIG. 31.

As shown in FIG. 32, the voltage VHH applied to the sources of PMOS transistors and the voltage VLL applied to the sources of NMOS transistors are each controlled to vary between active and standby sates of CMOS logic circuits.

That is, in the standby state of the Vt CMOS logic circuit, VHH and VLL are respectively set lower and higher than in the active state. Thus, the backgate of each of NMOS and PMOS transistors is biased deep in the standby state, which increases the threshold voltage of each transistor and allows the standby current to be reduced.

Although the first through fourth embodiments have been described as operating the VHH power supply circuit first and the VLL power supply circuit next, it is also possible to reverse the order in which the VHH and VLL power supply circuits are put into operation. This will be described below as a fifth embodiment of the present invention.

Figure 33:
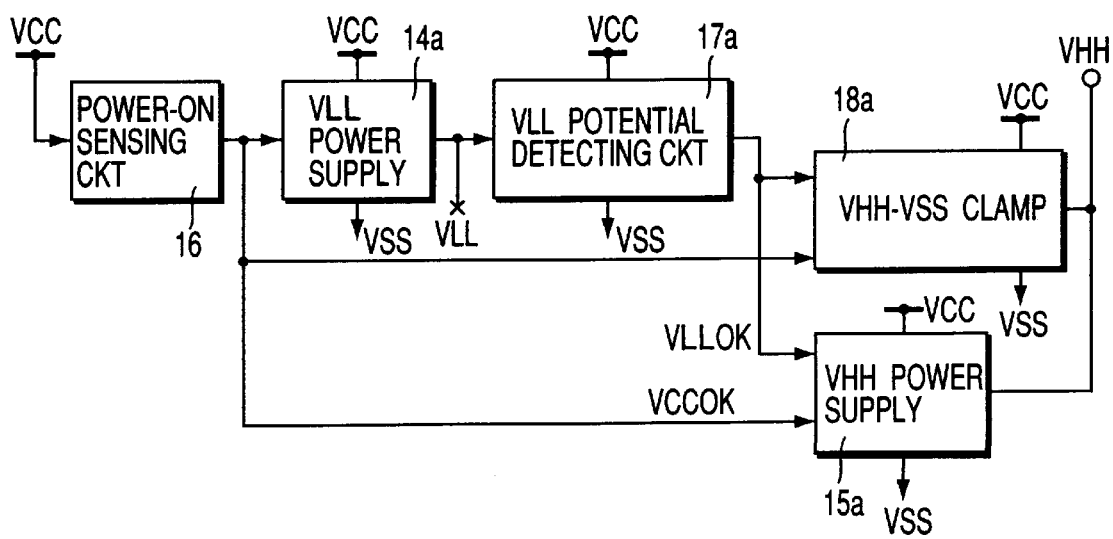
FIG. 33 is a block diagram of the power supply system of an NWL driving-based DRAM according to a fifth embodiment of the present invention.

FIG. 33 is a block diagram of a power supply circuit system of a DRAM according to the fifth embodiment of the present invention. This power supply circuit system is identical to that shown in FIG. 7 or FIG. 16 except for the following points:

(1) Instead of the VHH power supply circuit 15 in FIG. 7, a VLL power supply circuit 14a is provided which, upon receiving the control signal VCCOK from the power-on sensing circuit 16, initiates operation.

(2) Instead of the VHH potential detecting circuit 17 in FIG. 7, a VLL potential detecting circuit 17a is provided which detects the output voltage VLL of the VLL power supply circuit 14a reaching a specified value.

(3) Instead of the VLL power supply circuit 14 in FIG. 7, a VHH power supply circuit 15a is provided which, upon receiving the control signal VCCOK from the power-on sensing circuit 16 and the control signal VLLOK from the VLL potential detecting circuit 17a, initiates operation.

(4) Instead of the VLL-VSS clamp circuit 18 in FIG. 7, a VHH-VSS clamp circuit 18a is provided which controls the short-circuited/non-short-circuited state of the VHH node and the VSS node.

Figure 34:
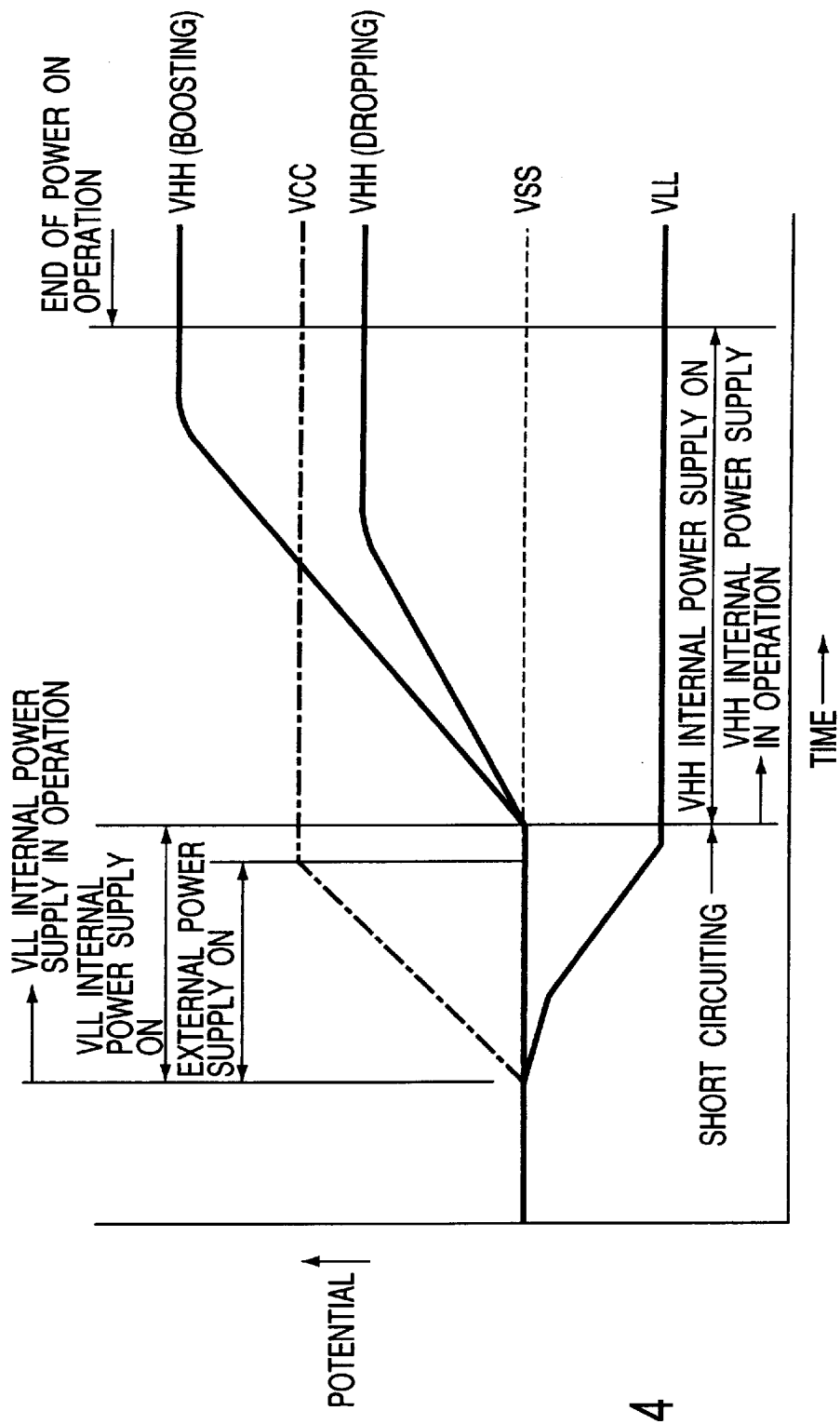
FIG. 34 shows operating voltage waveforms at power-on time in the power supply system of FIG. 33.

FIG. 34 shows operating waveforms at power-on time of the power supply circuit system of FIG. 33.

The operation of the power supply circuit system of FIG. 33 will be described below with reference to FIG. 34.

First, at power-on time, the external supply voltage VCC rises up to an operating supply voltage in a certain period of time. During the interval when VCC is below a certain specified value, the VLL-VSS clamp circuit 18a is responsive to the control signal VCCOK at the VSS level from the power-on sensing circuit 16 to perform a clamping operation, whereby the VHH node and the VSS node are short-circuited.

With this state held, the VLL power supply circuit 14a commences a boosting operation in the negative direction. The boosted voltage VLL rises gradually in the negative direction. When the boosted voltage VLL has reached a specified value, the VLL potential detecting circuit 17a outputs the control signal VLLOK, which in turn releases the VHH-VSS clamp circuit 18a from clamping. The VHH power supply circuit 15a is allowed to start a boosting or a dropping operation.

The boosted voltage VHH gradually is raised in the positive direction. The boosted voltage VHH upon reaching a specified value enables the row decoder to perform a word line drive operation based on the NWL driving technique.

That is, according to the NWL driving-based DRAM according to the fifth embodiment, at the start of power-on, the operation of the VLL power supply circuit 14a is commenced with the VHH power supply circuit 15a short-circuited to VSS.

When VLL rises according to an operation of the VLL power supply circuit 14a, the potentials on the internal signal lines of the row decoder become indeterminate or are placed in a transition state. At this point, it is required for the VHH power supply circuit 15a to have a current supply capacity sufficient to compensate for a through-current that flows from the VHH power supply circuit 15a to the VLL power supply circuit 14a. However, the through-current is compensated for by the VHH-VSS clamp circuit 18a and VHH is fixed at the VSS level, namely, 0 V.

Upon reaching the specified value, VLL enters the stable state. After VLL has reached the specified value, the clamped state where the VHH node is clamped to the VSS node by the VHH-VSS clamp circuit 18a is released, so that the operation of the VHH power supply circuit 15a is commenced.

Although the embodiments of the invention have been described in terms of a DRAM as an example of a semiconductor integrated circuit using more than one internal supply voltage, the principles of the present invention are generally applicable to LSI circuits that have more than one internal power supply.

In addition, as at least one of external power supplies, use may be made of a dropping power supply built in an LSI circuit.

According to the present invention, as described in detail above, it has become possible to produce internal supply voltages stably at power-on time by the provision of means for short-circuiting internal and external power supplies at power-on time. The invention is particularly effective for semiconductor integrated circuits having a first internal power supply for producing a potential VLL lower than 0 V (VSS) and a second internal power supply for producing a potential VHH higher than an external supply voltage VCC. The present invention is specially adapted for DRAMs adopting NWL techniques.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a first node for receiving a first voltage which is externally supplied;

a second node for receiving a second voltage that differs in magnitude from the first voltage;

a first internal power supply circuit responsive to at least the second voltage on the second node for producing a first internal supply voltage that differs in magnitude from the first voltage;

a first voltage detecting circuit connected to receive the second voltage from the second node for, upon detecting that the magnitude of the voltage on the second node has reached a first specified value, producing a first detect signal;

a second internal power supply circuit responsive to at least the second voltage on the second node for producing a second internal supply voltage that differs in magnitude from the second voltage;

a second voltage detecting circuit connected to receive the second internal supply voltage from the second internal power supply circuit for, upon detecting that the magnitude of the second internal supply voltage has reached a second specified value, producing a second detect signal which causes the first internal power supply circuit to start producing the first internal supply voltage; and a clamp circuit coupled to an output of the first internal power supply circuit and the first node for, upon receiving the second detect signal, releasing a short-circuited state of the output of the first internal power supply circuit and the first node.

2. The semiconductor integrated circuit according to claim 1, wherein the first voltage is ground voltage and the first internal power supply circuit produces a negative voltage as the first internal supply voltage.

3. The semiconductor integrated circuit according to claim 2, wherein the second voltage is a positive power supply voltage, and the second internal power supply circuit produces a voltage higher than the second voltage as the second internal supply voltage.

4. The semiconductor integrated circuit according to claim 3, further comprising a complementary logic circuit that includes a first MOS transistor of a first channel type having a source, a drain, a gate and a backgate and coupled at its source to the first voltage, and a second MOS transistor of a second channel type having a source, a drain, a gate and a backgate and coupled at its drain to the drain of the first MOS transistor and at its source to the second voltage, wherein the first and second MOS transistors are operated in a complementary manner.

5. The semiconductor integrated circuit according to claim 4, wherein the backgate of the first MOS transistor is coupled to the first internal supply voltage, and the backgate of the second MOS transistor is coupled to the second internal supply voltage.

6. The semiconductor integrated circuit according to claim 2, wherein the second voltage is a positive power supply voltage, and the second internal power supply circuit produces a voltage lower than the second voltage as the second internal supply voltage.

7. The semiconductor integrated circuit according to claim 6, further comprising a complementary logic circuit that includes a first MOS transistor of a first channel type having a source, a drain, a gate, and a backgate and coupled at its source to the first voltage, and a second MOS transistor of a second channel type having a source, a drain, a gate, and a backgate and coupled at its drain to the drain of the first MOS transistor and at its source to the second internal supply voltage, wherein the first and second MOS transistors are operated in a complementary manner.

8. The semiconductor integrated circuit according to claim 7, wherein the backgate of the first MOS transistor is coupled to the first internal supply voltage, and the backgate of the second MOS transistor is coupled to the second voltage.

9. The semiconductor integrated circuit according to claim 1, wherein the first voltage is ground voltage, and the first internal power supply circuit produces a positive voltage as the first internal supply voltage.

10. The semiconductor integrated circuit according to claim 9, wherein the first internal supply voltage is lower than the second voltage.

11. The semiconductor integrated circuit according to claim 9, wherein the second voltage is a positive power supply voltage, and the second internal power supply circuit produces a voltage higher than the second voltage as the second internal supply voltage.

12. The semiconductor integrated circuit according to claim 11, further comprising a complementary logic circuit that includes a first MOS transistor of a first channel type having a source, a drain, a gate and a backgate and coupled at its source to the first internal supply voltage, and a second MOS transistor of a second channel type having a source, a drain, a gate and a backgate and coupled at its drain to the drain of the first MOS transistor and at its source to the second voltage, wherein the first and second MOS transistors are operated in a complementary manner.

13. The semiconductor integrated circuit according to claim 12, wherein the backgate of the first MOS transistor is coupled to the first voltage, and the backgate of the second MOS transistor is coupled to the second internal supply voltage.

14. The semiconductor integrated circuit according to claim 9, wherein the second voltage is a positive power supply voltage, and the second internal power supply circuit produces a voltage lower than the second voltage as the second internal supply voltage.

15. The semiconductor integrated circuit according to claim 14, further comprising a complementary logic circuit that includes a first MOS transistor of a first channel type having a source, a drain, a gate and a backgate and coupled at its source to the first internal supply voltage, and a second MOS transistor of a second channel type having a source, a drain, a gate and a backgate and coupled at its drain to the drain of the first MOS transistor and at its source to the second internal supply voltage, wherein the first and second MOS transistors are operated in a complementary manner.

16. The semiconductor integrated circuit according to claim 15, wherein the backgate of the first MOS transistor is coupled to the first supply voltage, and the backgate of the second MOS transistor is coupled to the second voltage.

17. A semiconductor integrated circuit comprising:

a first node for receiving a first voltage which is externally supplied;

a second node for receiving a second voltage that differs in magnitude from the first voltage;

a first internal power supply circuit responsive to at least the second voltage on the second node for producing a first internal supply voltage that differs in magnitude from the first voltage;

a first voltage detecting circuit connected to receive the second voltage from the second node for, upon detecting that the magnitude of the voltage on the second node has reached a first specified value, producing a first detect signal;

a second internal power supply circuit responsive to at least the second voltage on the second node for producing a second internal supply voltage that differs in magnitude from the second voltage;

a second voltage detecting circuit connected to receive the first internal supply voltage from the first internal power supply circuit for, upon detecting that the magnitude of the first internal supply voltage has reached a second specified value, producing a second detect signal which causes the second internal power supply circuit to start producing the second internal supply voltage; and a clamp circuit coupled to an output of the second internal power supply circuit and the first node for, upon receiving the second detect signal, releasing a short-circuited state of the output of the second internal power supply circuit and the first node.

18. The semiconductor integrated circuit according to claim 17, wherein the first voltage is ground voltage and the first internal power supply circuit produces a negative voltage as the first internal supply voltage.

19. The semiconductor integrated circuit according to claim 18, wherein the second voltage is a positive power supply voltage, and the second internal power supply circuit produces a voltage higher than the second voltage as the second internal supply voltage.

20. The semiconductor integrated circuit according to claim 18, wherein the second voltage is a positive power supply voltage, and the second internal power supply circuit produces a voltage lower than the second voltage as the second internal supply voltage.

* * * * *